United States Patent
Barth et al.

(10) Patent No.: US 7,353,357 B2
(45) Date of Patent: Apr. 1, 2008

(54) APPARATUS AND METHOD FOR PIPELINED MEMORY OPERATIONS

(75) Inventors: Richard M. Barth, Palo Alto, CA (US); Ely K. Tsern, Los Altos, CA (US); Mark A. Horowitz, Menlo Park, CA (US); Donald C. Stark, Los Altos, CA (US); Craig E. Hampel, San Jose, CA (US); Frederick A. Ware, Los Altos Hills, CA (US); John B. Dillon, deceased, late of Palo Alto, CA (US); by Nancy David Dillon, legal representative, Washington, VA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/675,054

(22) Filed: Feb. 14, 2007

(65) Prior Publication Data

US 2007/0140035 A1 Jun. 21, 2007

Related U.S. Application Data

(60) Continuation of application No. 11/270,251, filed on Nov. 8, 2005, which is a continuation of application No. 10/817,781, filed on Apr. 2, 2004, now Pat. No. 6,963,956, which is a division of application No. 10/053,632, filed on Jan. 18, 2002, now Pat. No. 6,718,431, which is a division of application No. 09/169,526, filed on Oct. 9, 1998, now Pat. No. 6,356,975.

(60) Provisional application No. 60/061,682, filed on Oct. 10, 1997.

(51) Int. Cl.
*G06F 12/00* (2006.01)

(52) U.S. Cl. .......................... 711/167; 711/104; 711/5; 365/233; 365/189.04; 365/189.01; 365/189.03

(58) Field of Classification Search ................ 711/167, 711/169, 154, 5, 104; 365/189.04, 189.01, 365/189, 189.03, 230.5, 233, 233.5
See application file for complete search history.

(56) References Cited

U.S. PATENT DOCUMENTS 3,969,706 A  7/1976 Proebsting et al. ......... 340/170

(Continued)

FOREIGN PATENT DOCUMENTS

EP  487819 A2 * 6/1992

(Continued)

OTHER PUBLICATIONS

"Trends in High-Speed DRAM Architecture", Kumanoya et al., IEICE Trans. Electron. vol. E 79-C, No. 4, Apr. 1996, pp. 472-481.*

(Continued)

*Primary Examiner*—Pierre-Michel Bataille
(74) *Attorney, Agent, or Firm*—Morgan, Lewis & Bockius LLP

(57) ABSTRACT

A semiconductor memory device has a memory core that includes at least eight banks of dynamic random access storage cells and an internal data bus coupled to the memory core. The internal data bus receives a plurality of data bits from a selected bank of the memory core. The semiconductor memory device further comprises a first interface to receive a read command from external to the semiconductor memory device and a second interface to output first and second subsets of the plurality of data bits. The first subset is output during a first phase of an external clock signal and the second subset is output during a second phase of the external clock signal. The first phase includes a first edge transition and the second phase includes a second edge transition. The second edge transition is an opposite edge transition with respect to the first edge transition.

25 Claims, 37 Drawing Sheets

Writes after Reads and Dual Buses

U.S. PATENT DOCUMENTS

| | | | |
|---|---|---|---|
| 4,322,635 A | 3/1982 | Redwine | 307/221 |
| 4,330,852 A | 5/1982 | Redwine et al. | 365/221 |
| 4,434,474 A | 2/1984 | Best et al. | 364/900 |
| 4,449,207 A | 5/1984 | Kung et al. | 365/230 |
| 4,967,398 A | 10/1990 | Jamoua et al. | 365/230.05 |
| 5,142,276 A | 8/1992 | Moffat | 340/799 |
| 5,313,437 A | 5/1994 | Toda et al. | 365/236 |
| 5,323,358 A | 6/1994 | Toda et al. | 365/230.09 |
| 5,341,341 A | 8/1994 | Fukuzo | 365/253 |
| 5,367,494 A | 11/1994 | Shebanow et al. | 365/230.03 |
| 5,390,149 A | 2/1995 | Vogley et al. | 365/189.01 |
| 5,430,676 A | 7/1995 | Ware et al. | |
| 5,434,817 A | 7/1995 | Ware et al. | 365/189.01 |
| 5,471,607 A | 11/1995 | Garde | 395/550 |
| 5,475,829 A | 12/1995 | Thome | 395/479 |
| 5,511,024 A | 4/1996 | Ware et al. | 365/189.04 |
| 5,539,696 A | 7/1996 | Patel | 365/189 |
| 5,568,428 A | 10/1996 | Toda | 365/189.05 |
| 5,594,704 A * | 1/1997 | Konishi et al. | 365/233 |
| 5,604,705 A | 2/1997 | Ackland et al. | 365/205 |
| 5,644,537 A | 7/1997 | Toda | 365/189.05 |
| 5,655,113 A | 8/1997 | Leung et al. | 395/552 |
| 5,673,226 A | 9/1997 | Yumitori et al. | |
| 5,748,560 A | 5/1998 | Sawada | |
| 5,774,409 A | 6/1998 | Yamazaki et al. | 365/230.03 |
| 5,778,419 A | 7/1998 | Hansen et al. | 711/112 |
| 5,796,660 A | 8/1998 | Toda | 365/189.05 |
| 5,805,873 A | 9/1998 | Roy | 395/557 |
| 5,870,350 A | 2/1999 | Bertin et al. | |
| 5,923,611 A | 7/1999 | Ryan | |
| 5,956,274 A | 9/1999 | Elliott et al. | |
| 5,970,019 A * | 10/1999 | Suzuki et al. | 365/230.06 |
| 5,978,296 A * | 11/1999 | Zibert | 365/222 |
| 5,999,197 A | 12/1999 | Satoh et al. | |
| 6,006,290 A | 12/1999 | Suh | 710/35 |
| 6,018,478 A | 1/2000 | Higuchi | 365/189.01 |
| 6,035,369 A | 3/2000 | Ware et al. | 711/105 |
| 6,065,092 A | 5/2000 | Roy | |
| 6,088,280 A | 7/2000 | Vogley et al. | |
| 6,088,291 A | 7/2000 | Fujioka et al. | |
| 6,170,036 B1 | 1/2001 | Konishi et al. | |
| 6,202,119 B1 | 3/2001 | Manning | |
| 6,226,723 B1 | 5/2001 | Gustavson et al. | 711/170 |
| 6,266,737 B1 | 7/2001 | Ware et al. | 711/105 |
| 6,321,316 B1 | 11/2001 | Manning | 711/167 |
| 6,378,020 B2 | 4/2002 | Farmwald et al. | 710/129 |
| 6,470,405 B2 | 10/2002 | Barth et al. | 710/100 |
| 6,493,789 B2 | 12/2002 | Ware et al. | |
| 6,496,897 B2 | 12/2002 | Ware et al. | 711/105 |
| 6,553,449 B1 | 4/2003 | Dodd et al. | |
| 6,681,288 B2 | 1/2004 | Griffin et al. | 711/105 |
| 6,684,285 B2 | 1/2004 | Farmwald et al. | 710/305 |
| 6,728,819 B2 | 4/2004 | Farmwald et al. | 710/305 |
| 6,931,467 B2 | 8/2005 | Barth et al. | 710/100 |
| 7,197,611 B2 | 3/2007 | Barth et al. | 711/154 |
| 2002/0018393 A1 | 2/2002 | Kyung | |

FOREIGN PATENT DOCUMENTS

| | | |
|---|---|---|
| EP | 0 515 165 A1 | 11/1992 |
| EP | 0 617 364 A2 | 9/1994 |
| EP | 0759621 | 2/1997 |
| JP | 02003068072 | 3/2003 |
| WO | WO 79-00914 A1 | 11/1979 |
| WO | WO94 12935 | 6/1994 |
| WO | WO94 24628 | 10/1994 |
| WO | WO 02 05283 | 1/2002 |

OTHER PUBLICATIONS

MT48LC2M8xxS 2 Meg.times.8 SDRAM Micron Technology, Inc., Rev. Apr. 1996.*

"Synchronous Dram" Micron Technology, Inc., Rev. Apr. 1996.*

Future SDRAM-Clock Issues JEDEC Meeting Jan. 31, 1996.*

"M5M4V16807ATP-10, 12-, -15 Target Spec. (Rev. 0.3)", Mitsubishi Electri,May 7, 1993, pp. 1-36.

"400 Mb/s/pin SLDRAM" Data Sheet, SLDRAM, Inc., Jul. 1998.

Steven A. Przybyliski, "New DRAM Technologies, A Comprehensive Analysis of the New Architectures", pp. iii-iv, 119-121, 138-158, 177-203 (MicroDesign Resource 1994).

TMS626402, "2097 152-Word by Bank Synchronous Dynamic Random-Access Memory", Texas.

Instruments, 1994, pp. 5-3-5-23.

"Architectural Overview", Rambus, Inc., 1992, pp. 1-24.

"MT4LC4M4E9 (S) 4 MEG X DRAM", Micron Semiconductor, Inc., 1994, pp. 1-183-1-196.

Rambus Inc., "16/18Mbit (2M×8/9) & 64/72 Mbit (8M×8/9) Concurrent RDRAM - Advance Information," Rambus Inc. Data Sheet, Jul. 1996, 61 pages.

Rambus Inc., "8/9-Mbit (1M×8/9) & 16/18Mbit (2M×8/9) RDRAM - Preliminary Information," Rambus Inc. Data Sheet, Mar. 1, 1996, 30 pages.

"Draft Standard for a High-Speed Memory Interface (SyncLink)", Draft 0.99 IEEE P1596.7-199X, pp. 1-66 (1996).

Gillingham, Peter, "SLDRAM Architechtural and Functional Overview," SLDRAM Consortium, SLDRAM Inc., pp. 1-14 (Aug. 29, 1997).

MoSys, Inc., "MG802C256 Ultra Low Latency, High Performance 256K×32 SGRAM - Preliminary Information," Aug. 29, 1997, 1 page.

MoSys, Inc., "MD904 to MD920, 1/2 to 2 1/2 MByte Multibank DRAM (MDRAM) 128K×32 to 656×32 Preliminary Information," Feb. 21, 1997.

Yamashita et al., "A 3.84 GIPS Integrated Memory Array Processor LSI with 64 Processing Elements and a 2Mb SRAM," IEEE Journal of Solid-State Circuits, vol. 29, No. 11, pp. 1336-1343, Nov. 1994.

* cited by examiner

Combined Sense and Overlapped Writes

Writes after Reads and Dual Buses

APPARATUS AND METHOD FOR PIPELINED MEMORY OPERATIONS

This application is a continuation of U.S. patent application Ser. No. 11/270,251, filed Nov. 8, 2005, which is a continuation of U.S. patent application Ser. No. 10/817,781, filed Apr. 2, 2004, which issued as U.S. Pat. No. 6,963,956 on Nov. 8, 2005, which is a divisional of U.S. patent application Ser. No. 10/053,632 filed on Jan. 18, 2002, which issued as U.S. Pat. No. 6,718,431 on Apr. 6, 2004; which is a divisional of U.S. patent application Ser. No. 09/169,526 filed on Oct. 9, 1998, which issued as U.S. Pat. No. 6,356,975 on Mar. 12, 2002; which claims priority to U.S. Provisional Application No. 60/061,682 filed Oct. 10, 1997. All of the aforementioned applications are hereby incorporated by reference.

BACKGROUND OF THE INVENTION

1. Field of the Invention

This invention relates generally to semiconductor devices. More particularly, this invention relates to techniques for performing pipelined memory operations in memory devices.

2. Description of the Related Art

The need for high performance memory systems has increased due to the demand for increased performance central processor units and graphics processing units. High performance has two aspects that are important in memory system design. The first aspect is high throughput (sometimes termed effective or sustainable bandwidth). Many processor and graphics units perform a large number of operations per second and put a proportionally high rate of memory requests upon the memory system. For example, a graphics system may require that a large number of pixels in a display be updated in a frame time. Commonly, a graphics display may have a million pixels and require an update 70 to 100 times per second. If each pixel requires computation on about 10 to 16 bytes of memory for every frame, this translates to a throughput requirement of about 0.7 to 1.6 Gigabytes/second. Thus, a memory subsystem in a graphics application must be able to handle a high rate of memory requests. Another aspect of these memory requests is that they have a reference pattern that exhibits poor locality. This leads to a requirement that the requests from the graphics application be specifiable at the required throughput for the requests.

The second aspect of high performance is low service time for the application, where service time is the time for the memory system to receive and service a request under the load of the given application. An example of an application where service time is important is the case of a processor making a memory request that misses its cache and requires a memory operation to service the miss in the midst of other memory traffic. During the time of the miss, the processor may be stalled waiting for the response. A processor with a 4 ns cycle time may have to wait 20 cycles or more to receive a response to its request depending on the service time of the memory system, thus slowing down the processor. Memory requests from the processor also have poor locality of reference due to the use of processor caches. This implies a requirement that the request be fully specifiable at the time the request is made so that the request can enter the memory system without delay. Thus, there is a need for low service time for a memory request.

Another important factor for improving memory speed is memory core technology. Memory systems that support high performance applications do so with a given memory core technology where the term memory core refers to the portion of the memory device comprising the storage array and support circuitry. An example of a memory core 100 is shown in FIG. 1 and is discussed in more detail below. One of the more important properties of the memory core is the row cycle time (tRC), which is shown in FIG. 4. Typically, the row cycle time is fairly slow, being on the order of 60 to 80 ns. However, a large amount of data, on the order of 1 KBytes or more, is accessed from the storage array in this time, implying that the storage array is capable of high throughput. However, the reference streams for the applications discussed above do not need large amounts of data with fairly slow cycle times. Instead, the pattern is to access small amounts of data with very short cycle times. Another important property is the column cycle time (tPC), which is shown in FIG. 7. Once a memory core has performed a row access and obtained the 1 Kbytes or so of row data, one or more column cycles is required to obtain some or all of the data. The construction of the core is such that a reference stream that sequentially accessed some or all of the row data is best, rather than a reference stream that moved to another row and then returned to the first row. Again the reference streams of practical applications do not fit this pattern. The application reference stream has very poor spatial locality, moving from row to row, only accessing some small portion of the data in the row, making poor use of the relatively high column cycle rate that is possible. Thus, an interface system is required in the memory device to help adapt the high throughput and low service time demands of the application reference stream to the properties of the memory core. One of the primary limitations in current memory technology to adapt to the application reference stream is not enough resources, including bank and control resources, in a memory device. By introducing enough resources into the device and operating these resources in a concurrent or pipelined fashion, such a memory device can meet or exceed the current demands without substantially increasing the cost of the memory device.

Another property of memory cores is that they have greatly increased in capacity with 256 Megabit or larger devices being feasible in current and foreseeable technology. For cost and other reasons, it is desirable to deliver the high performance demanded from a single memory device. The benefits of using a single memory device are that the performance of the memory system does not depend so much on the presence of multiple devices, which increase cost, increase the size of incremental additions to the memory system (granularity), increase the total power required for the memory system and decrease reliability due to multiple points of failure. Total power in the memory system is reduced with a single memory device because power is dissipated only in the single device which responds to a memory request, whereas, in a memory system with multiple devices responding to a memory request, many devices dissipate power. For example, for a fixed size application access and fixed memory core technology, a multiple device system with N components will access N times as many memory bits, consuming N times the power to access a row.

In view of the foregoing, it would be highly desirable to provide improved memory systems. Ideally, the improved memory systems would provide high performance and improved memory core technology.

SUMMARY OF THE INVENTION

A single high performance memory device having a large number of concurrently operated resources is described. The concurrently operated resources include bank resources and control resources. Added bank resources in the memory device permit multiple banks to be operated concurrently to both reduce service time and increase throughput for many applications, especially ones with poor locality of reference. Added control resources operating concurrently in a high frequency pipeline break up a memory operation into steps, thus allowing the memory device to have high throughput without an adverse effect on service time. A single memory device delivering high performance may be combined with additional memory devices to increase the storage capacity of the memory system, while maintaining or improving performance compared to that of the single memory device.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DESCRIPTION OF THE PREFERRED EMBODIMENTS

Figure 1:
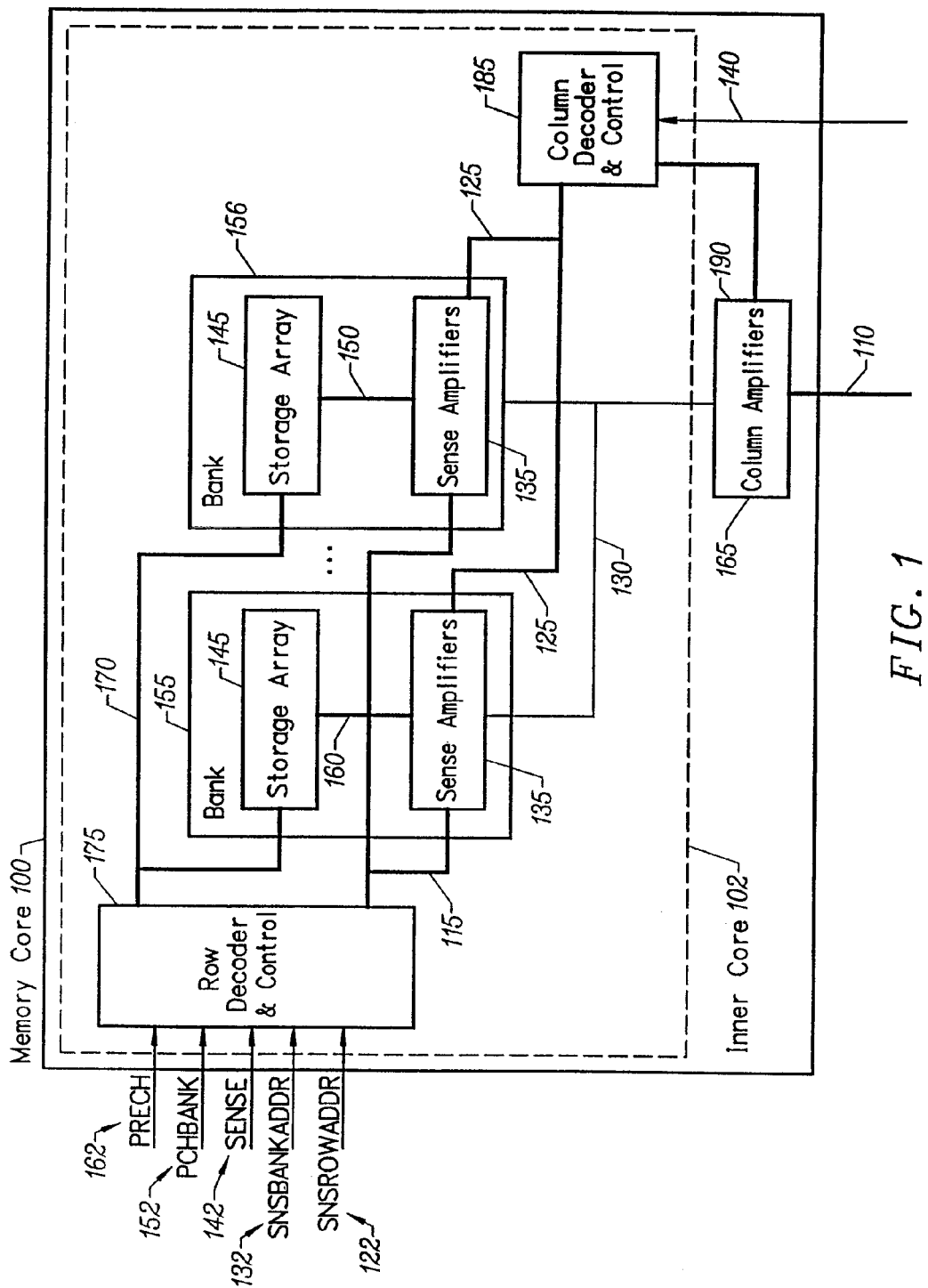
FIG. 1 illustrates a memory core that may be utilized in accordance with an embodiment of the invention.
Figure 2:
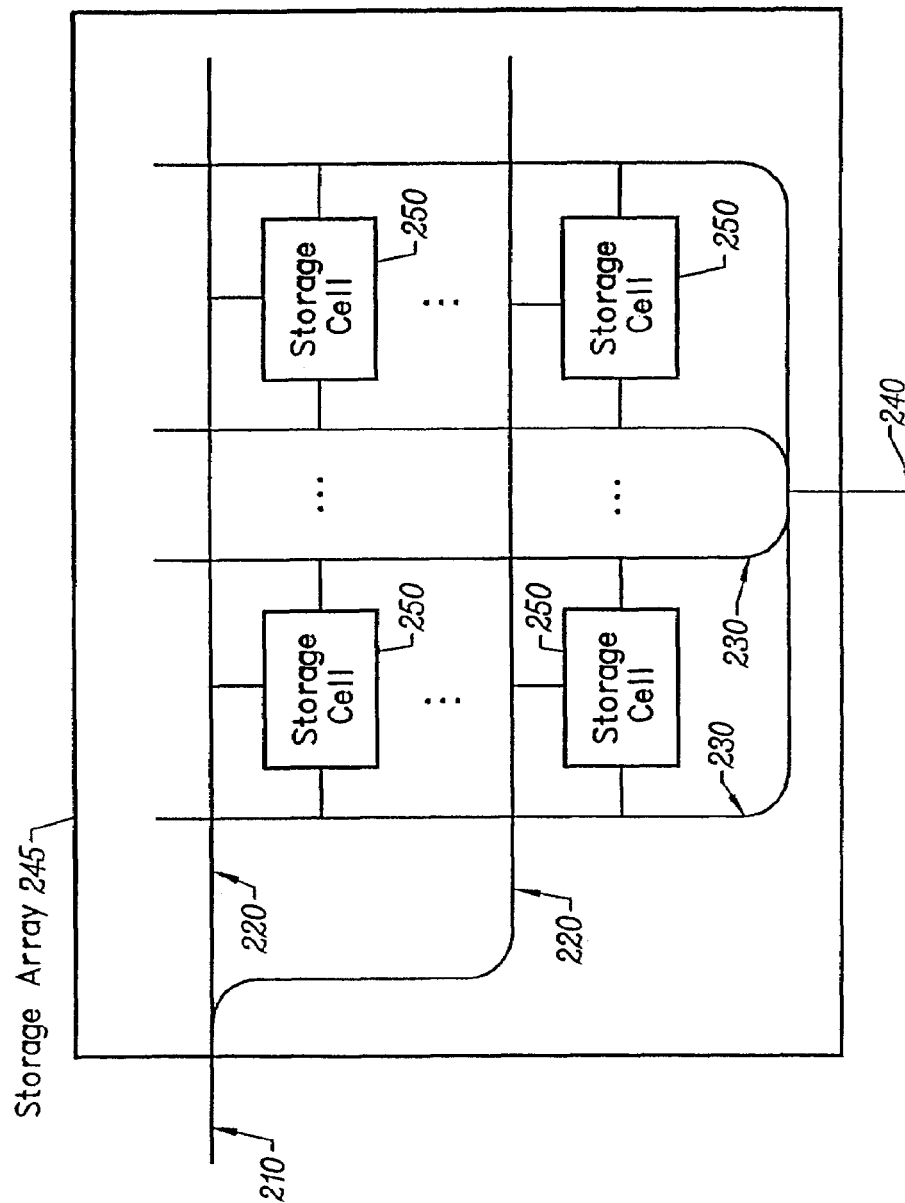
FIG. 2 illustrates a memory storage array that may be utilized in accordance with an embodiment of the invention.

Since the present invention is directed toward interface operations with a memory core, a memory core and its operation is initially described. FIG. 1 shows important blocks that constitute a representative memory core 100. Storage array 145, which includes the actual storage cells 250 shown in FIG. 2, is shown with various circuit blocks necessary to store and retrieve data from the storage array 145. Support circuitry shown in FIG. 1 includes row decoder and control block 175, a column decoder and control-block 185, sense amplifiers 135 and column amplifiers 165. Inner core 102 has the same circuitry except for the column amplifiers 165. The row decoder and control 175 receives row control and address signals PRECH 162, PCHBANK 152, SENSE 142, SNSBANKADDR 132, and SNSROW-ADDR 122 and drives wordline signals 170 into the storage array and row control signals 115 into the sense amplifiers. The column decoder 185 receives the column address and control signals 140 and drives the column select lines 125 to the sense amplifiers 135 and column control signals 190 to the column amplifiers 165. Sense amplifiers 135 receive the column select lines 125, the row control signals 115, and the array data 160 and 150 from the storage array. Finally, column amplifiers 165 receive the sense amplifier data 130 and the column control signals 190 and drive the sensed data 110 to circuits outside the memory core or data to be written into the sense amplifiers.

FIG. 2 shows the arrangement of the storage cells 250 in the storage array 245. Lines 210 entering the storage array correspond to lines 170 in FIG. 1 and are the wordlines 220 used for selecting a row of storage cells. Lines 240 correspond to lines 160 in FIG. 1 and are the bit lines used for receiving data from one of the columns 230 of a selected row of cells.

Figure 3:
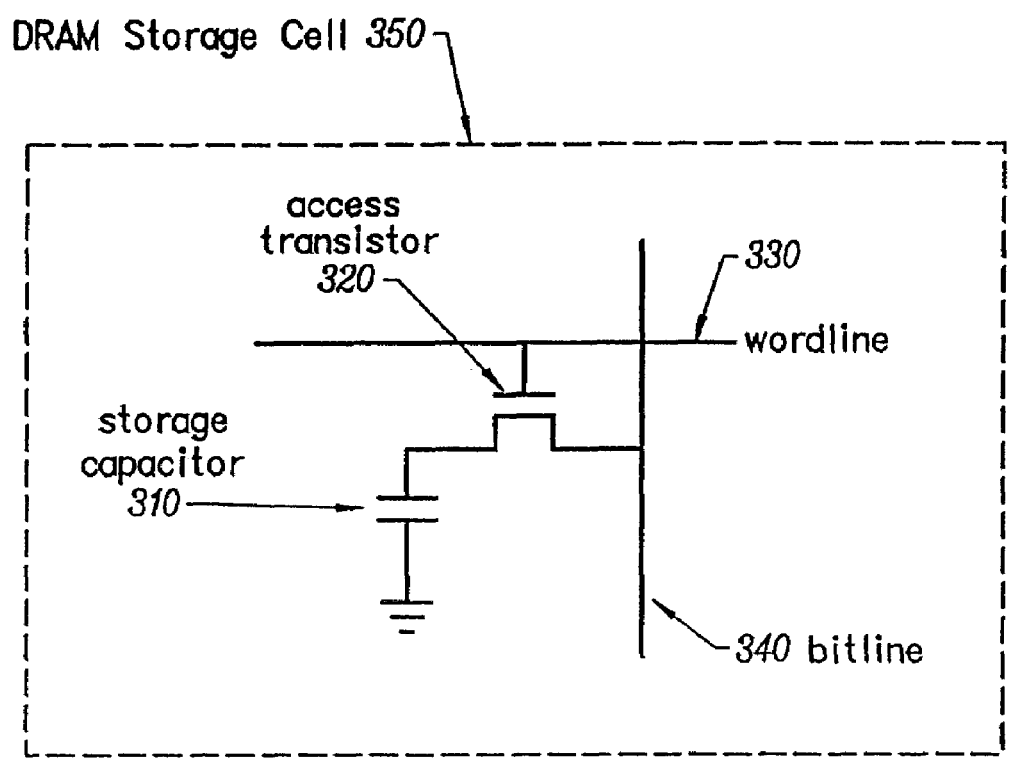
FIG. 3 illustrates a DRAM storage cell that may be utilized in accordance with an embodiment of the invention.

FIG. 3 shows a storage cell 350 which comprises an access transistor 320 coupled to the wordline 330 and a storage capacitor 310 on which the data is stored as a charge. The charge on the storage capacitor 310 is coupled through the access transistor 320 to the bitline 340 when the wordline 330 is activated. When access transistor 320 couples the stored charge to the bit line, the charge on the storage capacitor is reduced and may need to be restored if data is to be preserved.

Figure 4:
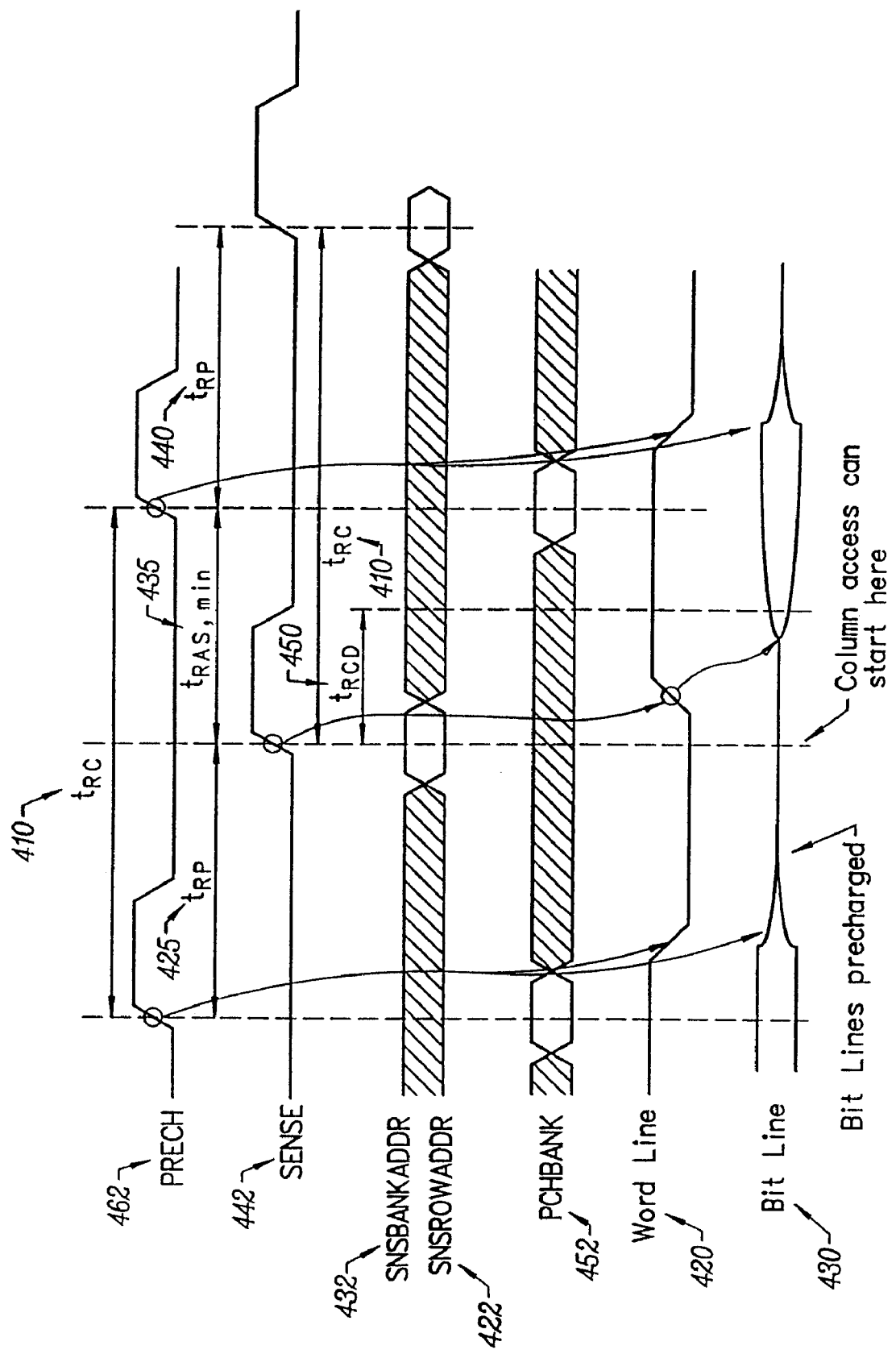
FIG. 4 illustrates DRAM row timing operations that may be exploited in accordance with an embodiment of the invention.

Performing a row access on the memory core depicted in FIG. 1 requires that the signal waveforms shown in FIG. 4 conform to certain important timing restrictions. In particular, precharge signal PRECH 462, which initiates a cycle upon a certain bank PCHBANK 452 that prepares the bit lines to receive the stored charge, has the restriction that its cycle time be no shorter than parameter tRC 410. Sense signal 442, which initiates a cycle upon a particular bank SNSBANKADDR 432 and row SNSROWADDR 422 to couple the stored charge to the sense amplifiers, has a similar requirement as shown in the figure. Upon receiving the sense signal 442, a wordline 420 is activated and a bit line 430 responds to the stored charge being coupled to it. After a time, tRCD 450, a column access of data in the sense amplifiers may be performed. Next, the sensed data in the sense amplifiers is restored back onto the storage cells and finally another precharge, lasting a time tRP 425 after tRAS, min 435, is allowed, which again prepares the bit lines for another cycle. The table below gives the typical times for these parameters. It is important to note that DRAM timing parameters can vary widely across various memory core designs, manufacturing processes, supply voltage, operating temperature, and process generations.

As may be determined from Table 1, an access from a core requiring a precharge before a sense operation takes about 45 ns and the cycle takes about 80 ns, the difference 35 ns being the time to restore the charge on the accessed storage cells. Thus, accessing a row that requires a precharge first (an open row) takes a substantial amount of time, and a row cycle takes even more time.

TABLE 1

Typical DRAM Row Timing Parameters

| Symbol | Description | Value | Units |
|---|---|---|---|
| tRP | Row precharge time | 20 | ns |
| tRCD | Row to column delay | 25 | ns |
| tRC | Row cycle time | 80 | ns |
| tRAS, min | Minimum row active time | 60 | ns |

Figure 5:
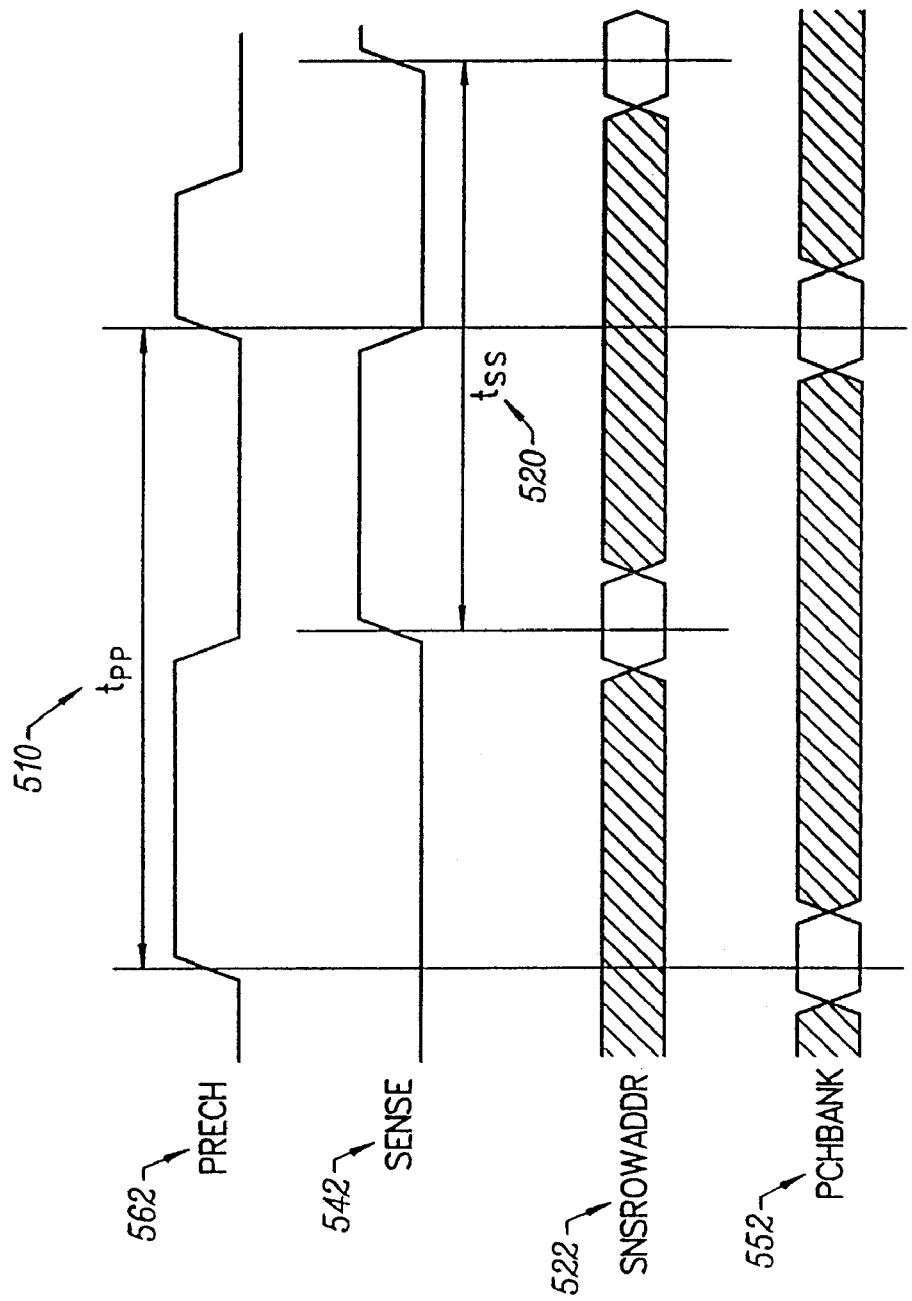
FIG. 5 illustrates DRAM row timing operations that may be exploited in accordance with an embodiment of the invention

Referring back to FIG. 1, it should be noted that multiple banks are shown. In particular, bank 155 has a separate storage array and set of sense amplifiers and bank 156 has a separate storage array and set of sense amplifiers. Banks 155 and 156 may be independent in the sense that one bank may be carrying out a precharge operation, while the other is performing a sense operation, given sufficient control from the row decoder and control block 175. Thus, having multiple banks permits concurrent operation between the banks. However, there are some additional restrictions, which are shown in FIG. 5. In particular, parameter tPP 510 determines the minimum time between precharge operations to different banks in the same device and parameter tSS 520 determines the minimum time between sense operations between different banks in the same device. These parameters are on the order of 10 to 20 ns, which is less than the access time from a single bank and smaller than the cycle parameter tRC, which applies to a single bank. Typical DRAM row timing parameters for multiple banks are shown in Table 2.

TABLE 2

Typical DRAM Row Timing Parameters - Multiple Banks

| Symbol | Description | Value | Units |
|---|---|---|---|
| tSS | Sense to Sense time - different banks | 20 | ns |
| tPP | Precharge to Precharge time - different banks | 20 | ns |

Multiple banks may be coupled in some memory cores to other banks, preferably adjacent banks. In particular, if a bank shares a portion of its sense amplifiers with another bank, it is dependent upon that bank in that the two cannot be operated concurrently. However, having dependent banks permits a large number of banks in a core without the heavy penalty associated with the same large number of sense amplifier arrays, many of which can be operated without constraint. One problem that does arise is that precharging the banks becomes more complex. A precharge may be required for each bank, resulting in a large number of precharge operations. Alternatively, the memory core can convert a precharge operation of one bank into a precharge of that bank and the banks dependent upon it. In another alternative, the memory device circuitry can convert a bank precharge into multiple operations, as will be discussed below.

Figure 6:
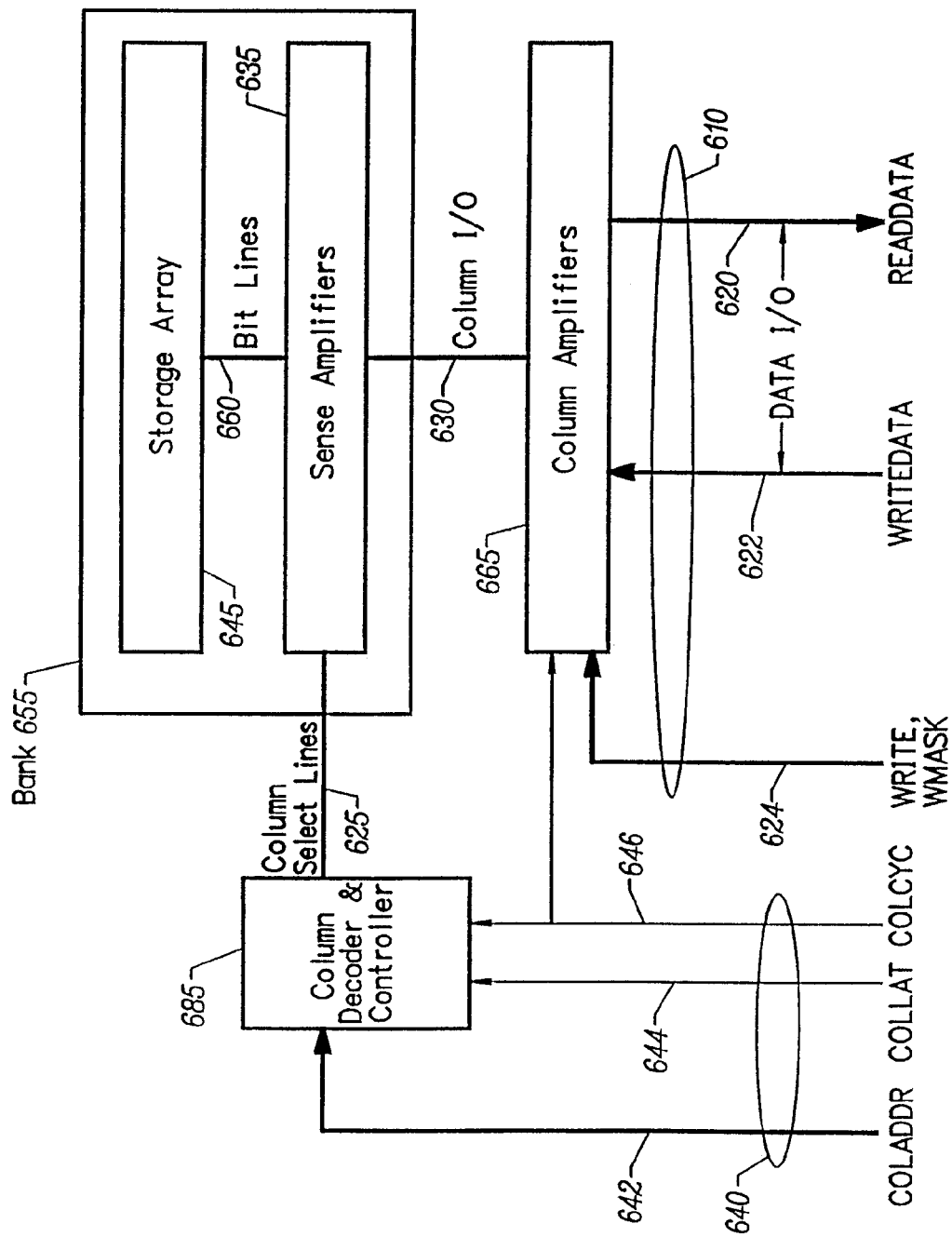
FIG. 6 illustrates a memory architecture that may be exploited in connection with an embodiment of the invention.
Figure 7:
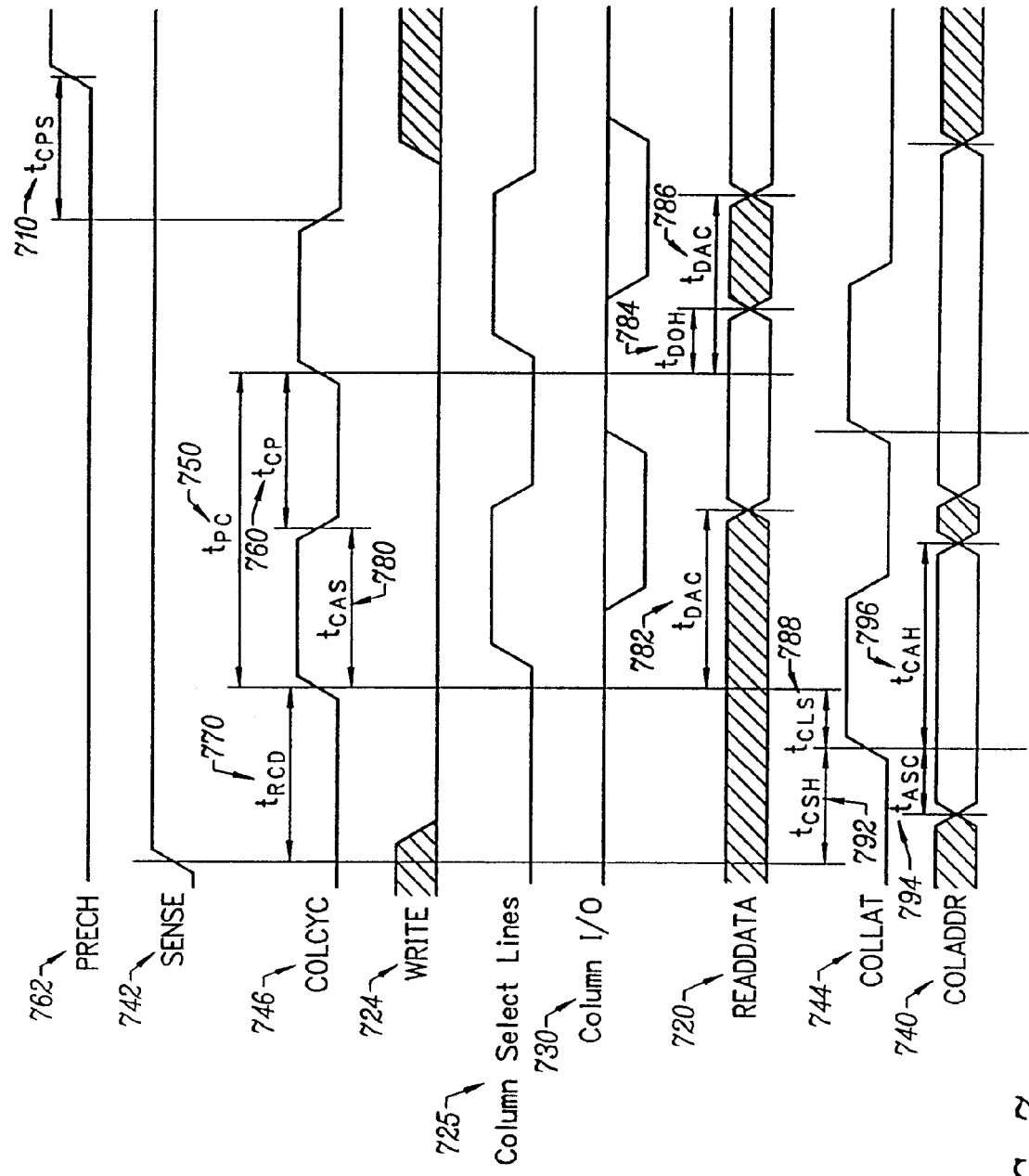
FIG. 7 illustrates column read timing operations that may be utilized in accordance with an embodiment of the invention.

FIG. 6 shows, in more detail, the structure to support a column operation in a memory core. In FIG. 6, column decoder 685 receives the column control signals and the column address signals 640 and drives the column select lines 625 into the sense amplifiers 635 to select some or all of the outputs from the sense amplifiers. Sense amplifiers 635 receive the bit lines 660 from the storage array 645, the column select lines 625 from the column decoder and controller and the selected amplifiers drive the column I/O lines 630 into the column amplifiers 665. Column amplifiers 665 receive one of the column control signals 646 from the column control 640, the write data 622 and the write mask 624 when necessary. Column amplifiers 665 also drive read data 620 to circuitry external to the memory core. Typically, the column I/O lines 630 are differential and are sensed by differential column amplifiers in order to speed column access time. Shown in FIG. 6 is the case of bidirectional column 110 lines 630 over which the write data and read data are carried. Alternatively, column I/O 630 is unidirectional, meaning that there are separate pathways for write data and read data into and out of the sense amplifiers from the column amplifiers. It is preferred that data I/O WRITEDATA 622 and READDATA 620 be kept on separate buses. This allows for some concurrency between the sense amplifiers and the column amplifiers as discussed below. In an alternative memory core, the data I/O lines are bidirectional, wherein the WRITEDATA and READDATA share the same bus. The number of lines in the WRITEDATA bus 622 and the READDATA bus 620 determine the amount of data, or column quantum, for each column access from the core. Typical sizes range from 64 bits to 256 bits for each bus, but the size may be different for different applications. The structure in FIG. 6 is operated according to the timing constraints shown in FIG. 7 for a read operation and FIG. 8 for a write operation.

Column read operations require cycling of two important signals, COLLAT 744 and COLCYC 746, with minimum cycle time tPC 750. Typically, the column cycle time tPC is about 10 ns. The signal COLLAT 744 starts slightly ahead of COLCYC 746 by parameter tCLS 788 and latches the column address 740 in the column decoder. This permits the COLADDR to be introduced into the column decoder for the next cycle, while the data is available on the previous cycle and helps to remove the delay of the column decoder from the access path cycle time. Signal COLLAT 744 is a minimum delay of tCSH after the SENSE signal discussed above. COLADDR meets standard set and hold times tASC and tCAH with respect to the COLLAT signal. The signal COLCYC 746 cycles at the same minimum rate tPC as the COLLAT signal and the availability of read data is a delay tDAC 782 from the leading edge of COLCYC. Signal COLCYC has two parameters, tCAS 780 for its high time and tCP 760 for its low time. These and the other parameters shown in the diagram are listed in the table 3 below.

TABLE 3

Typical DRAM Column Timing Parameters

| Symbol | Description | Value | Units |
|---|---|---|---|
| tPC | Column cycle time | 10 | ns |
| tCAS | COLCYC high | 4 | ns |
| tCP | COLCYC low | 4 | ns |
| tCLS | COLLAT to COLCYC setup | 2 | ns |
| tDAC | READDATA valid from COLCYC rising | 7 | ns |
| tCPS | COLCYC low setup time to row precharge | 1 | ns |
| tASC | COLADDR setup to COLLAT rising | 0 | ns |
| tCAH | COLADDR hold from COLLAT rising | 5 | ns |
| tDOH | READDATA hold from next COLCYC rising | 3 | ns |
| tDS | WRITEDATA setup to COLCYC rising | 0 | ns |
| tDH | WRITEDATA hold from COLCYC falling | 1 | ns |
| tWES | WMASK setup to COLCYC rising | 2 | ns |
| tWEH | WMAST hold from COLCYC falling | 0 | ns |

Figure 8:
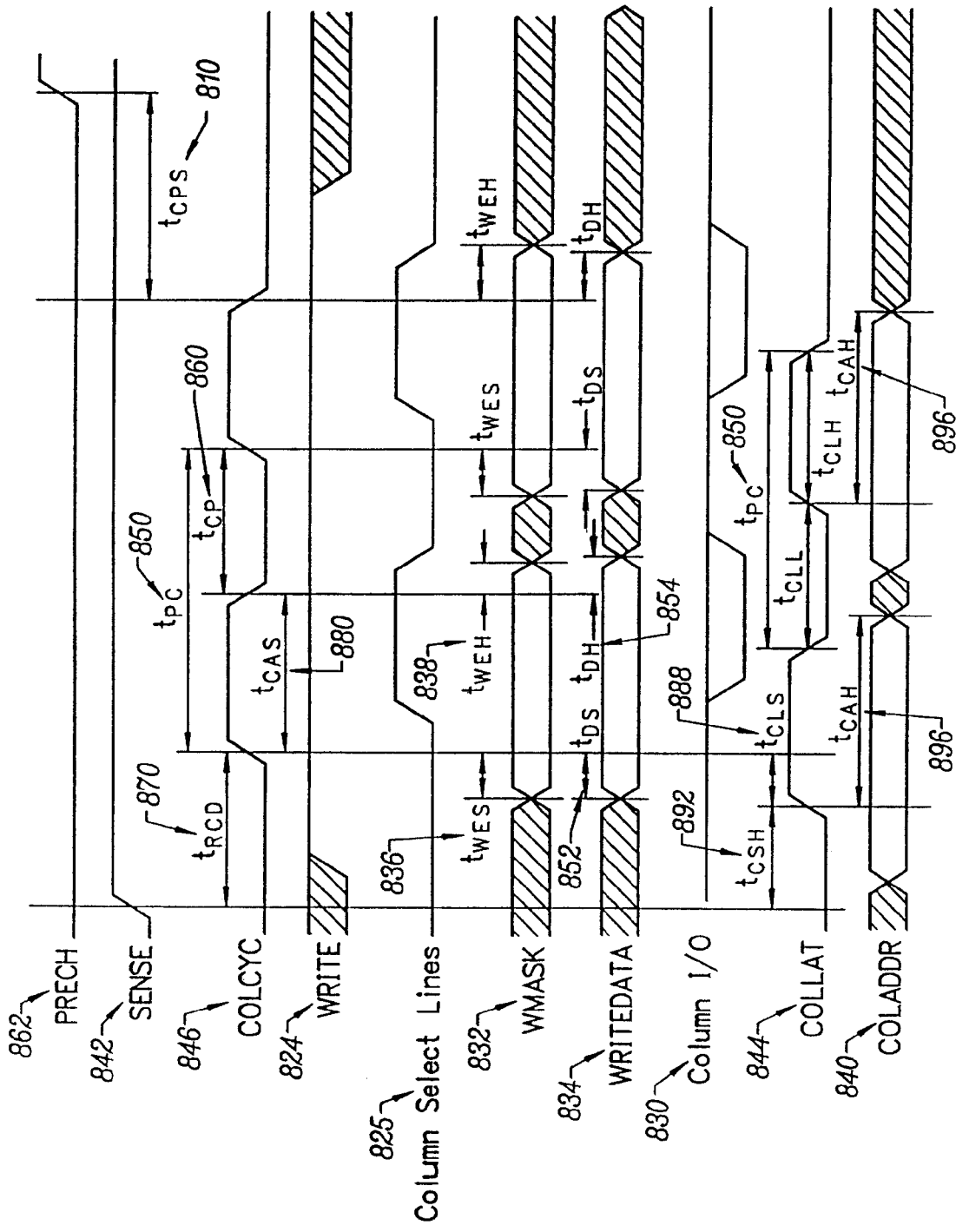
FIG. 8 illustrates column write timing operations that may be utilized in accordance with an embodiment of the invention.

FIG. 8 shows the column write operation. The column write cycle is similar to the read cycle for the signals COLCYC 846 and COLLAT 844. The major difference is that the WRITEDATA 834 is setup by an amount tDS 852 prior to the COLCYC signal. Furthermore, the WRITEDATA is held until an mount tDH after the time tCAS 880 expires on the COLCYC signal 846. The WMASK 832 input has about the same timing as the WRITEDATA signal and is governed by parameters tWES 836 and tWEH 838.

As can be seen by the parameters involved, a column cycle can occur rather quickly compared to a row cycle. Typical column cycle times are about 10 ns as compared to the 80 ns for a row cycle. As will be noted below, it is desirable to maintain a sequence of column quantum accesses at the column cycle rate, under a variety of application reference streams.

Figure 9:
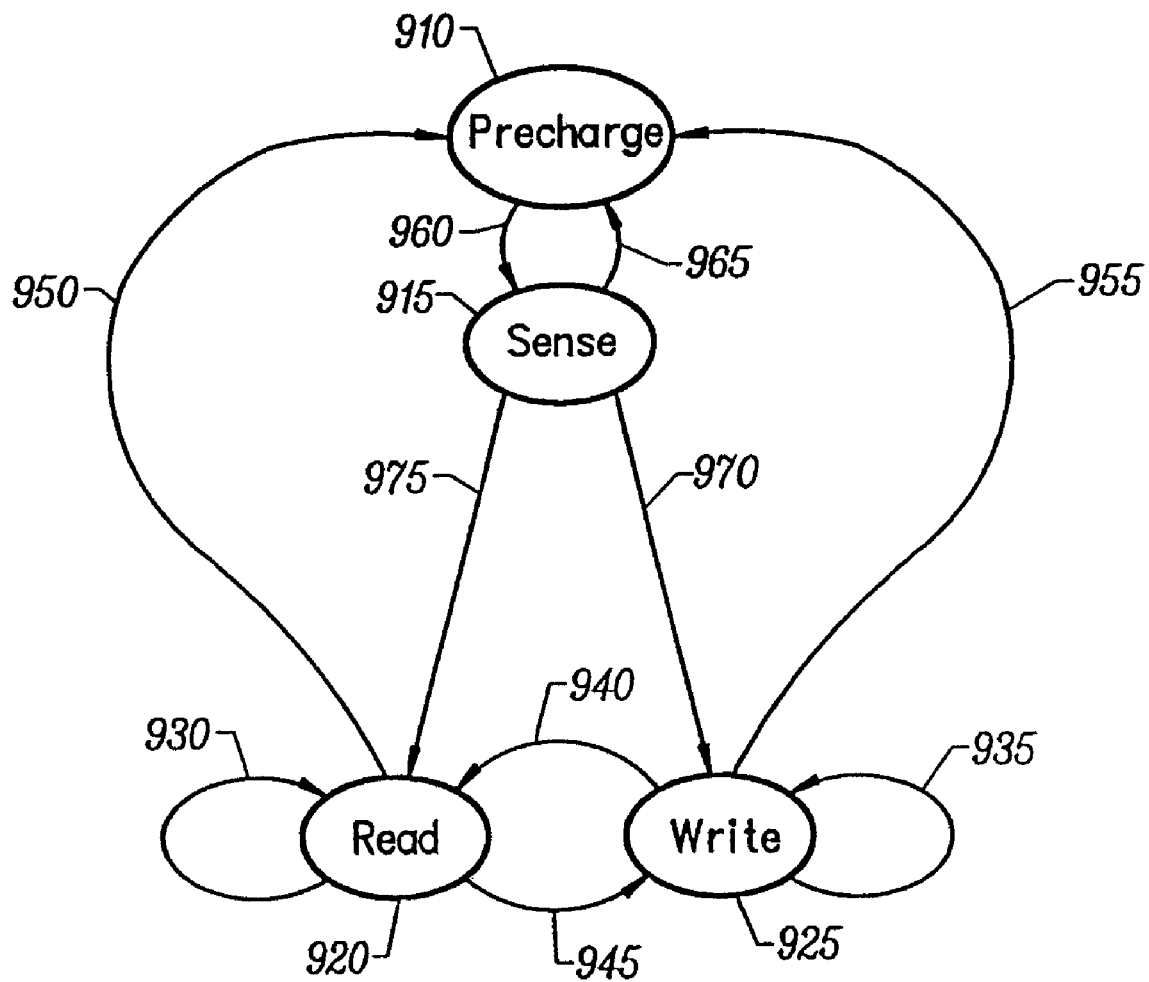
FIG. 9 illustrates a state diagram depicting conventional memory core operations.

It is possible to resolve the row and column operations discussed above into the operations of sense, precharge, read and write. FIG. 9 is an operation sequence diagram which shows these operations and the permissible transitions between them for the conventional memory core. Transitions 960 and 965 show that a precharge operation 910 may follow or precede a sense operation 915. After a sense operation, a read operation 920 or write operation 925 may follow as shown by transitions 975 and 970 respectively. Transitions 940, 945, 930 and 935 show that read and write operations may occur in any order. Finally, after any read or write operations, only a precharge may follow, as shown by transitions 950 and 955. A diagram such as in FIG. 9 may be constructed for each of many different types of memory cores, including static RAM, dynamic memory, NAND dynamic memory and read only memory. For each different type of core, there are a different set of operations and a different set of permissible transitions between them.

Figure 10:
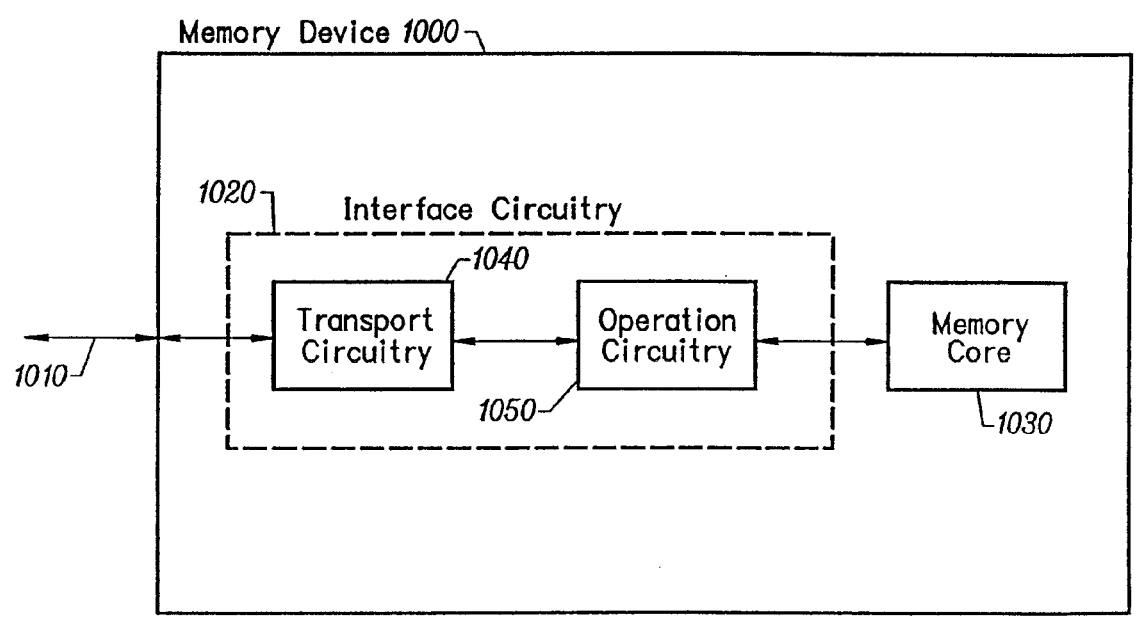
FIG. 10 illustrates a memory device constructed in accordance with an embodiment of the invention.

FIG. 10 shows an embodiment of a memory device 1000 for the present invention. Memory device 1000 comprises interface circuitry 1020 and a memory core 1030 of the type discussed above, whether fabricated as a circuit block on a substrate with other circuitry or as a stand-alone device. Memory core 1030 is coupled to the interface circuitry 1020 and interface circuitry 1020 is coupled to external connections 1010. Interface circuitry includes transport circuitry 1040 and operation circuitry 1050, which is coupled to the transport circuitry 1040 and to the memory core 1030. Transport circuitry 1040, operation circuitry 1050 and memory core 1030 operate concurrently with each other to form a pipeline.

Figure 11:
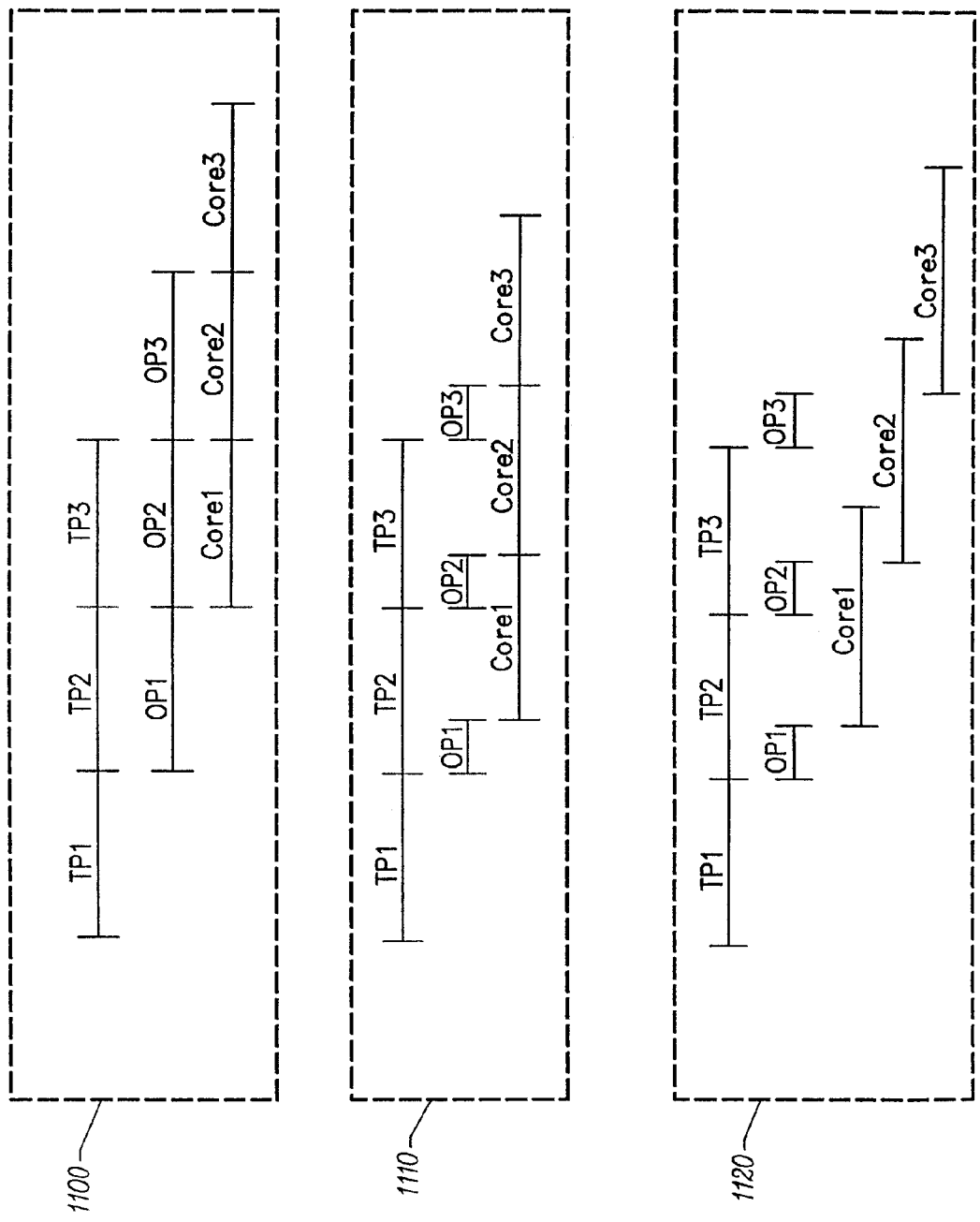
FIG. 11 illustrates memory access operations in accordance with an embodiment of the invention.

Several examples of this concurrent operation are shown in FIG. 11. Timing diagram 1100 shows time intervals for the transport circuitry as TP1, TP2 and TP3, time intervals for the operation circuitry as OP1, OP2 and OP3, and time intervals for the memory core as Core1, Core2 and Core3. These time intervals represent times that each block of circuitry is active performing the functions required of it. The transport circuitry is adapted to the transfer properties of the external connections 1010 and functions to collect and disburse information describing memory device functions to and from the external connections 1010 in FIG. 10. The operation circuitry 1050 is adapted to the specific properties of the memory core and functions to command a timing sequence to carry out an operation, such as sense, precharge, read or write, on the memory core 1030 in FIG. 10.

In FIG. 11, timing diagram 1100 shows the case where time intervals TP1, TP2 and TP3, OP1, OP2 and OP3, and Core 1, Core2 and Core3 are all equal. During TP3 the transport circuitry collects external information, while the operation circuitry commands a core operation and while the core carries out a previously scheduled operation. In a particular embodiment, timing diagram 1100 may represent read, write, sense or precharge operations.

In timing diagram 1110, the time intervals in the operation circuitry OP1, OP2, and OP3 are shorter than the transport time intervals TP1, TP2 and TP3. Core operations Core1, Core2 and Core3 take the same time as in diagram 1100.

Timing diagram 1120 shows the case where the operation circuitry intervals OP1, OP2, OP3 are shorter than the transport intervals, but the core intervals are longer than the transport intervals. This causes the core to overlap its operations and in general the core must be designed to handle such a case. For example, a core may be designed to perform a concurrent precharge and sense operation or a concurrent precharge and read or write operation.

Figure 12:
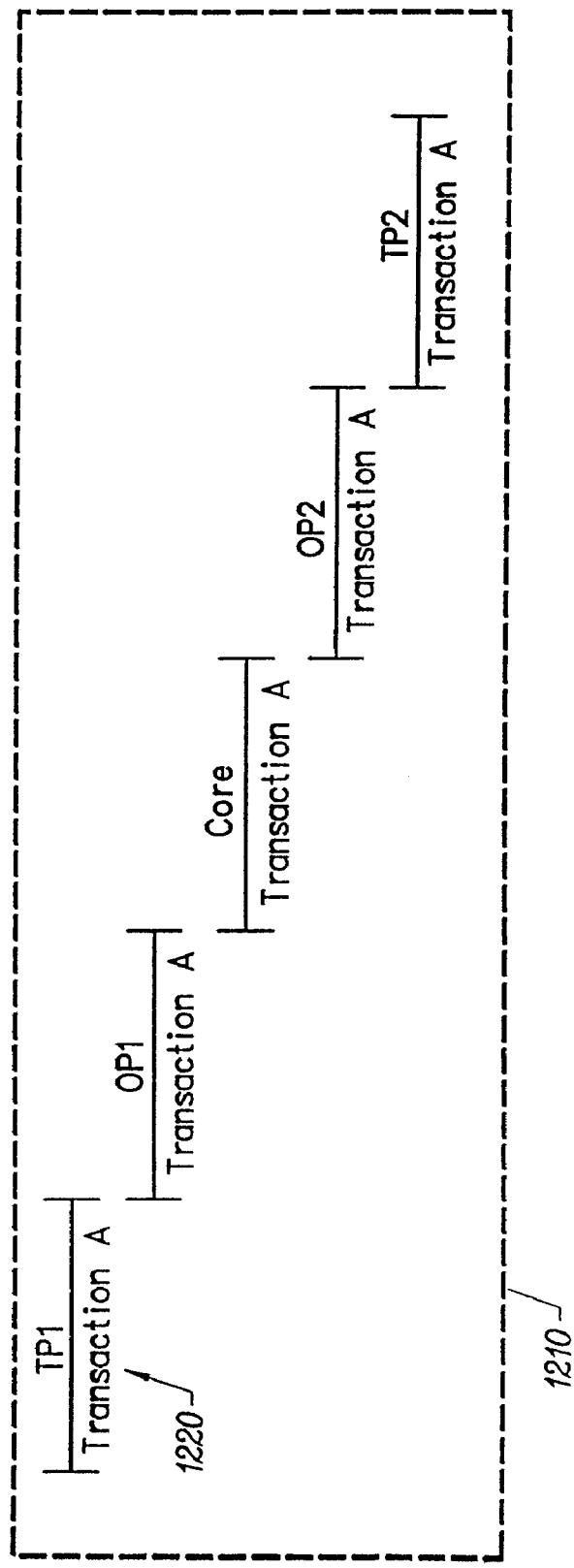
FIG. 12 illustrates pipelined memory access operations in accordance with an embodiment of the invention.

FIG. 12 shows the stages of the pipeline constructed from the transport, operation, and core circuitry for a single transaction moving through the stages. Transaction A 1220 is assembled during interval TP1 in the transport circuitry. It then moves on to the operation circuitry which takes time interval OP1 to specify a core operation to carry out the transaction. Next, the core operation specified is carried out by the core during the core interval after which the transaction moves back to the operation circuitry during OP2 with the results of the core operation. The results can be data from a core operation or a message indicating that the core operation has completed. Finally, during TP2 the transaction results are conveyed to the external connections.

Figure 13:
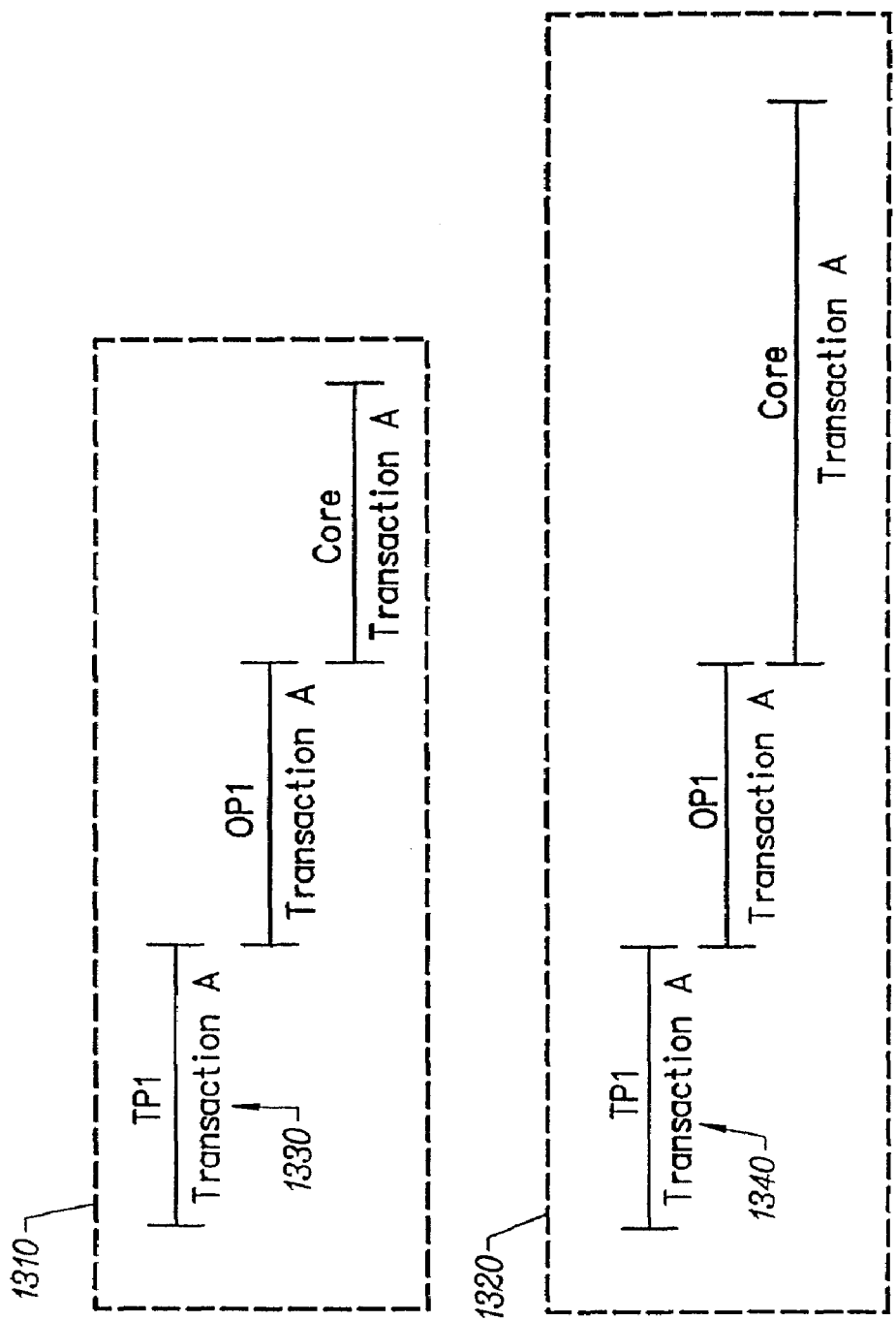
FIG. 13 illustrates memory access operations in accordance with an embodiment of the invention.

FIG. 13 shows, in timing diagram 1310, the case in which Transaction A 1330 has fewer steps, TP1, OP1 and Core, through the pipeline. Nothing is returned to the external connections in this case. Instead a core operation is started and it runs to completion. In one embodiment, the case depicted in timing diagram 1310 is a precharge operation.

FIG. 13 shows, in timing diagram 1320, the case in which Transaction A 1340 has steps TP1, OP1 and Core except that a relatively long core operation is started and completes on its own. In one embodiment, the case shown is a sense operation.

Figure 14:
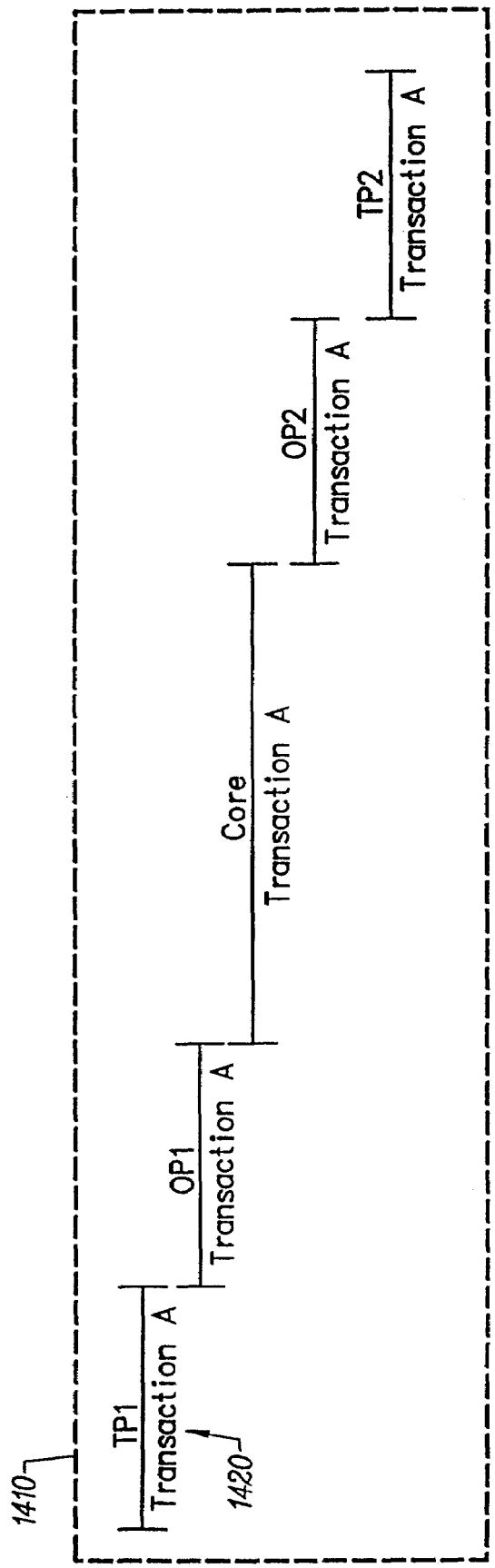
FIG. 14 illustrates pipelined memory access operations in accordance with an embodiment of the invention.

FIG. 14 shows the case, in timing diagram 1410 in which Transaction A 1420 moves through stages TP1, OP1, Core, OP2 and TP2. This case is similar to that in FIG. 12 except that the Core operation takes a relatively long time compared to the time for TP1, OP1, OP2 and TP2.

Figure 15:
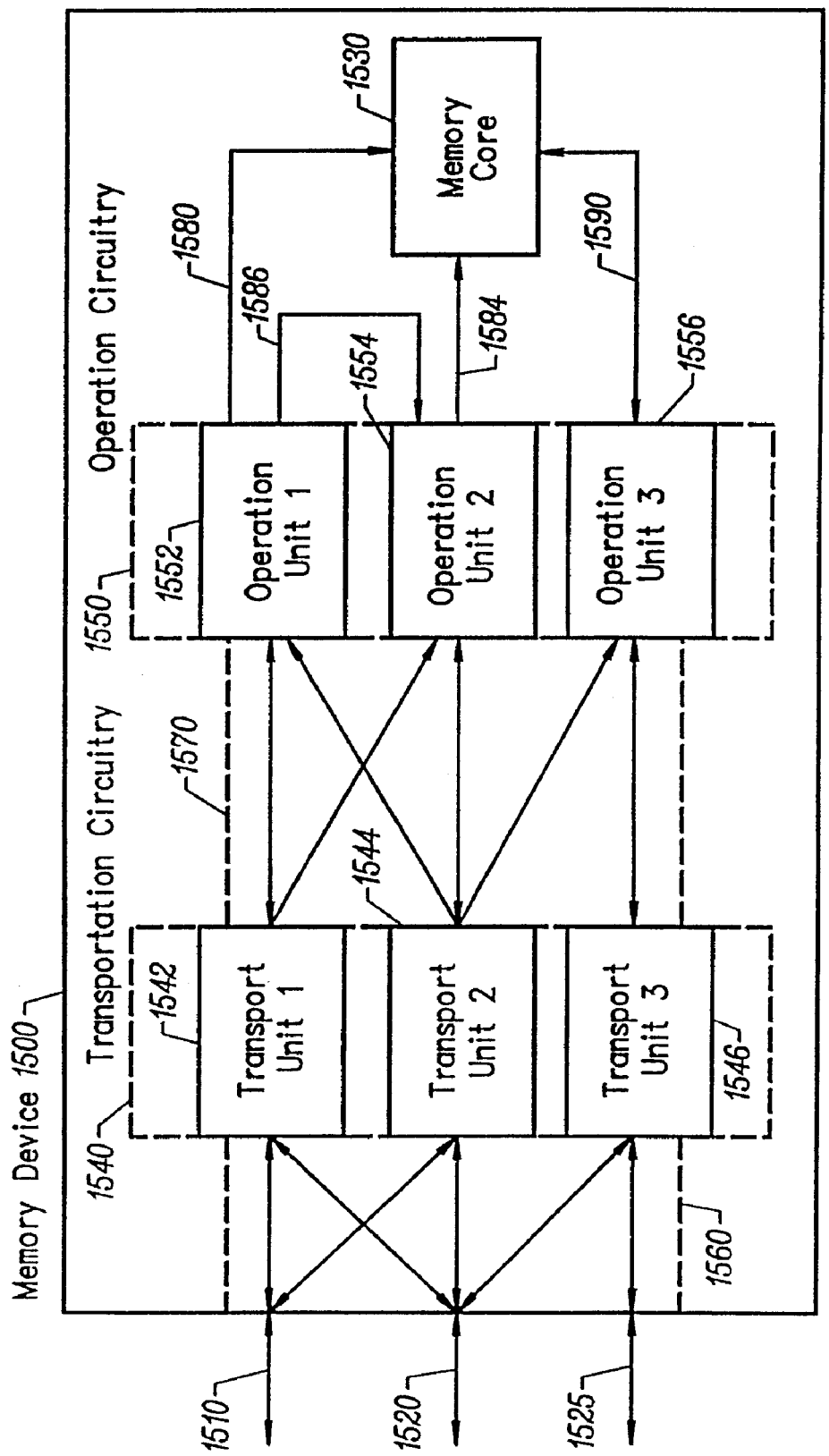
FIG. 15 illustrates a memory device constructed in accordance with an embodiment of the invention.

FIG. 15 shows an embodiment according to the present invention in which the transport circuitry and the operation circuitry comprise one or more units to increase the number of resources supporting the pipeline. In particular, transport circuitry 1540 includes Transport Unit 1 1542, Transport Unit 2 1544 and Transport Unit 3 1546. The transport units are coupled to external connections 1510, 1520 and 1530 which represent independent information pathways to and from memory device 1500. As shown in FIG. 15, the transport units couple to the independent pathways via connection matrix 1560. Each pathway 1510, 1520 and 1530 carries information that may be useful to one or more of the transport units. Transport units 1542, 1544, 1546 also couple via connection matrix 1570 to Operation Circuitry 1552 which includes Operation Unit 1 1552, Operation Unit 2 1554, and Operation Unit 3 1556. Connection matrix 1570 allows for an operation unit to transfer information to or from one or more transport units. Finally, memory core 1530 couples to Operation Unit 1 1552 via path 1580, to Operation Unit 2 1554 via path 1584 and Operation Unit 3 1556 via path 1590. Pathway 1586 demonstrates that one operation unit can act on another operation unit rather than the memory core.

In FIG. 15 each transport unit operates concurrently with the other transport units responding to information coupled to it from external connections 1510, 1520 and 1525, internal operation units 1550 and connection matrices 1560, 1570. Also, each operation unit operates concurrently with the other operation units. Each operation unit receives the information it needs from one or more transport units and carries out the specified operation on the memory core or other operation units. Since transport circuitry operates concurrently with operation circuitry, in effect all of the units, operation or transport, operate concurrently with each other. This potentially large number of concurrent resources improves the throughput of the memory device. However, it is necessary to decide what resources are actually required in the memory device to implement the pipeline for a particular memory core so that every possible sequence of operations can be handled by the pipeline.

To make this determination, tables are constructed based on the particular type of memory core to catalog every possible sequence based on the state of the memory core. Tables 4 and 5 illustrate the case of a conventional memory core having the sequence of operations described in FIG. 9. In Table 4 there are only three possibilities based on the state of a row in a bank on which a transaction is to occur based on the valid sequence of operations shown in FIG. 9. Either the bank is closed, meaning the last operation was a precharge (empty) and the transaction targeted the closed bank, the bank is open (meaning that the last operation was not a precharge), but the bank sense amplifiers do not contain the row targeted for the current operation (miss), or the bank was open and the row targeted for the operation is in the sense amplifier (hit). The sequence (sense, transfers (i.e., series of column read or write operations), precharge) is an empty transaction type, because the bank was closed. It is termed a nominal transaction because after the transfers, the bank is closed, leaving the state of the bank unchanged. The sequence (precharge, sense, transfers) is a miss transaction because the bank had to be closed and a new row transferred to the bank sense amplifiers for the transaction. The sequence (transfers) is a hit because the targeted bank was open with the targeted row in the bank sense amplifiers.

TABLE 4

Nominal Transactions

| Initial Bank State | Final Bank State | Transaction Type | Operations Performed |
|---|---|---|---|
| closed | closed | empty | (sense, transfers, precharge) = STP |
| open | open | miss | (precharge, sense, transfers) = PST |
| | | hit | (transfers) = T |

Table 5 catalogs the cases which change the state of the bank, either from open to closed or visa-versa. The transitional empty precedes a sense operation to the nominal hit, thus changing the state of the bank from closed to open due to the sense. The transitional miss transaction follows a precharge to a nominal miss, thus closing the row opened by the miss and changing the state of the bank. The transitional hit transaction precedes a precharge to a nominal hit, thus closing the already open row and changing the state of the bank. In Table 5, items having braces are optionally performed.

TABLE 5

Transitional Transactions

| Initial Bank State | Final Bank State | Transaction Type | Operations Performed |
|---|---|---|---|
| closed | open | empty | sense, {transfers} = ST |
| open | closed | miss | (precharge, sense, transfers}, precharge = PSTP |
| | | hit | {transfers}, precharge = TP |

Figure 22:
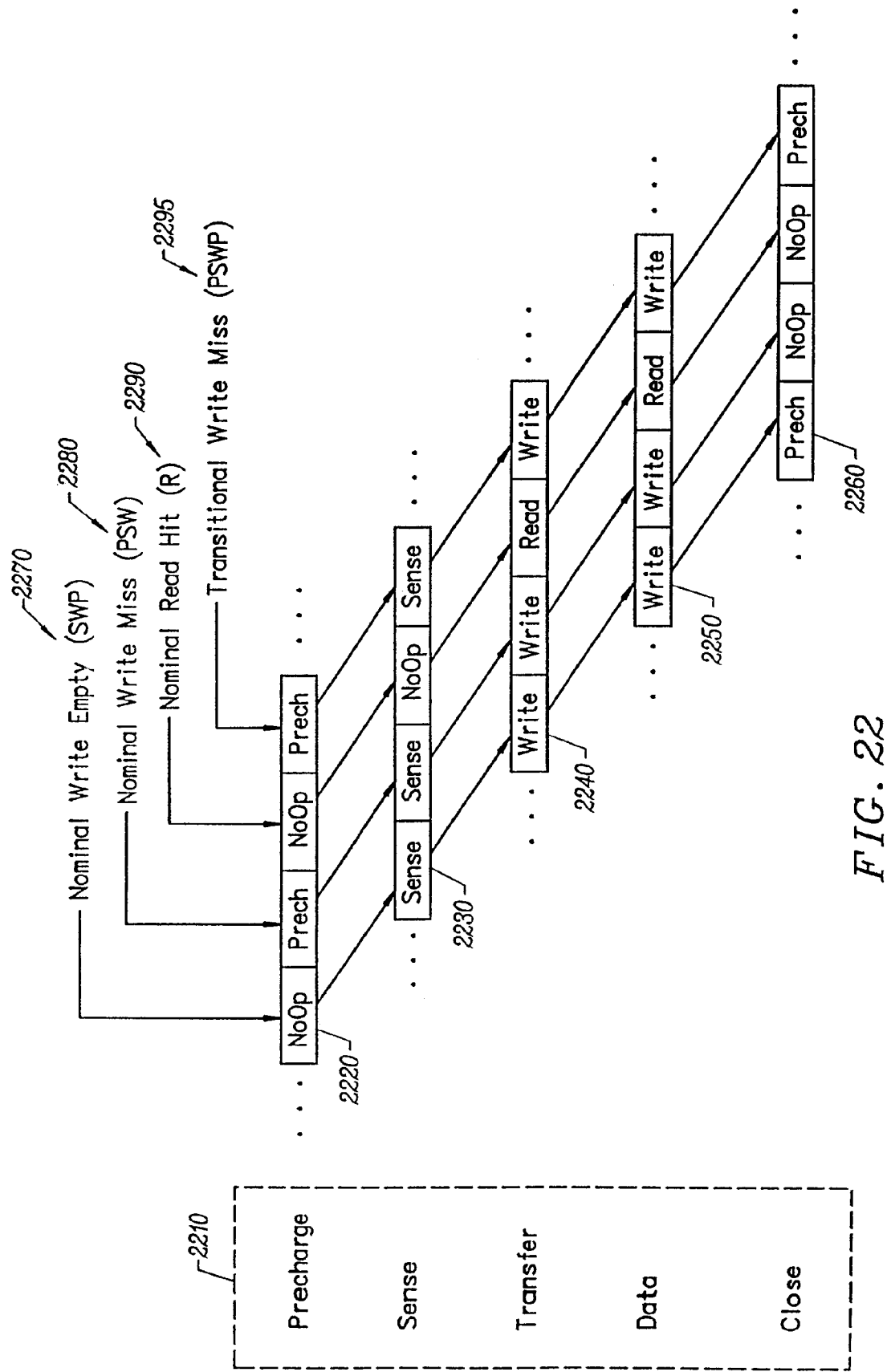
FIG. 22 illustrates memory access operations in accordance with an embodiment of the invention.

As can be determined by inspection, the sequence PSTP, called a universal sequence, covers all of the transaction types. No matter what the type, a pipeline constructed to service the PSTP sequence will handle every possible transaction that could occur given a conventional memory core. For other memory core types, different tables are constructed based on the permissible operation sequences for that core type and a different universal sequence is determined. An example of some of the sequences that can be serviced by the PSTP pipeline is shown in FIG. 22. Pipeline resources 2210 along with the activity of the resources during four time slots are represented in the figure. For example, precharge resource performs a NoOp, Prech, NoOp and Prech during the four time slots to service the four example sequences. In order that there be no conflicts or waiting in the pipeline, each transaction must start at the beginning of the pipe. If the particular transaction does not need the resources of a stage, a NoOp is inserted to preserve the timing. Alternatively, in a case where a stage will not be used in the next available time, an operation is inserted into that stage, thus skipping a pipeline stage or stages, and reducing the time to service a request. Because the pipeline can service any sequence of operations, a new transaction may be started at the front of the pipe on every new time slot. A pipeline so constructed is a conflict-free pipeline in that it has no structural hazards. Note that the relative timing of the stages is only constrained by the timing requirement of the memory core. For example, precharge step 2260 may occur earlier than data transport 2250.

Based on the information above, the transport and operation units necessary to support a conflict-free pipeline for a conventional memory core are now determined. In what follows the close operation is the same as a precharge operation, except that it is the last step in the universal sequence.

Figure 16:
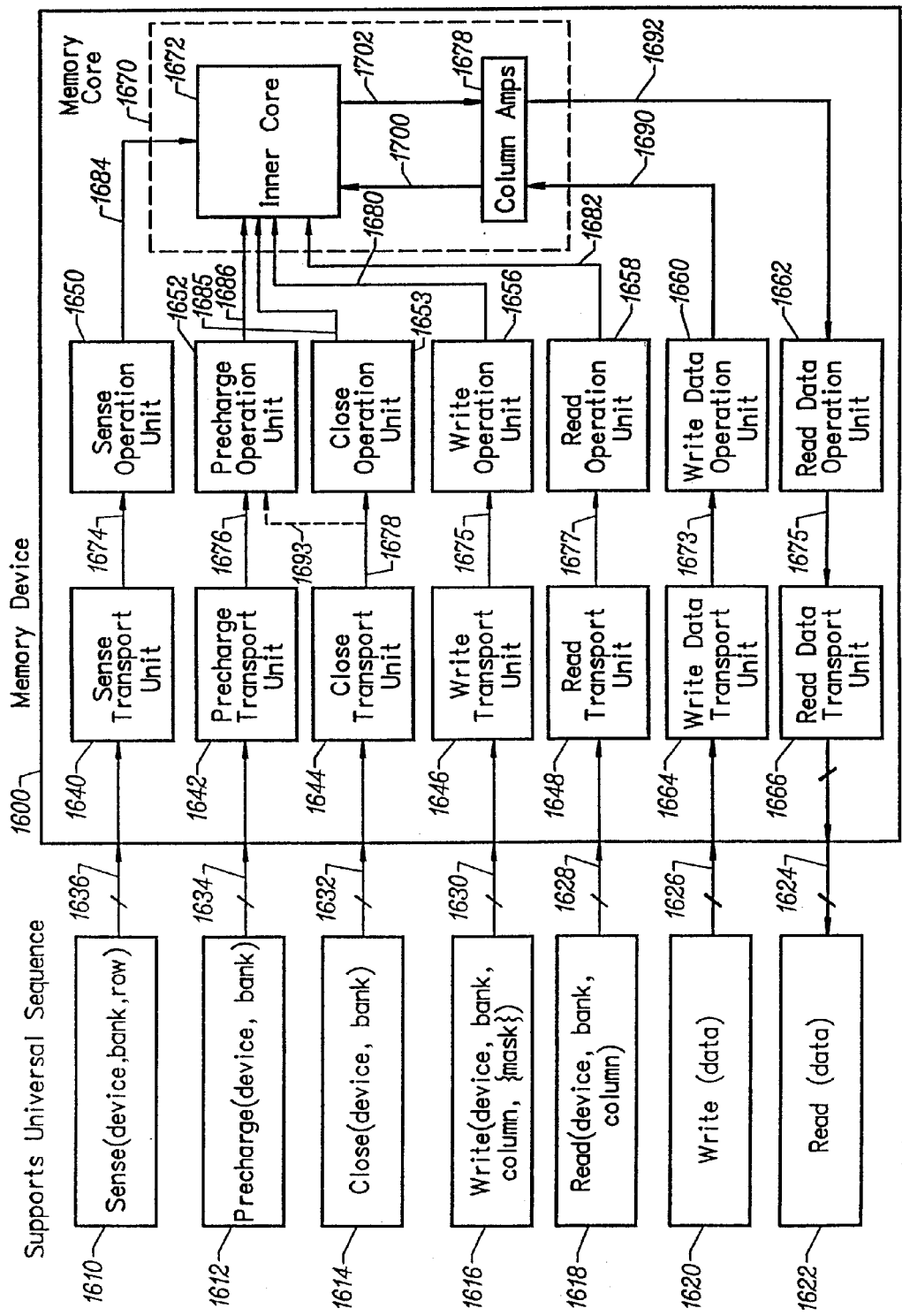
FIG. 16 illustrates a memory device constructed in accordance with an embodiment of the invention.

FIG. 16 shows an embodiment according to the present invention suitable to support the universal sequence for a conventional memory core. In this figure, memory device 1600 includes Sense Transport Unit 1640, Precharge Transport Unit 1642, Close Transport Unit 1644, Write Transport Unit 1646, Read Transport Unit 1648, Write Data Transport Unit 1664, and Read Data Transport Unit 1666. The memory device also includes Sense Operation Unit 1650, Precharge Operation Unit 1652, Close Operation Unit 1653, Write Operation Unit 1656, Read Operation Unit 1658, Write Data Operation Unit 1660, Read Data Operation Unit 1662, and memory core 1670. Each transport unit transfers a specific set of information to or from the external connection to which it is coupled. Each operation unit is coupled to the transport units according to the information that the operation unit needs to carry out its function. Each operation unit is also coupled to either the core or another operation unit, depending on the operation unit's function or functions.

Individual transport units are depicted in FIG. 16. In FIG. 16, the Sense Transport Unit 1640 is coupled to external connections 1636 to receive sense information 1610, which is shown in simplified form as Sense (device, bank, row). Thus, the sense information comprises a device field to specify a memory device among a plurality of memory devices, a bank field to specify the particular bank in a multibank core, a field to specify a row in that bank on which the sense operation is to be performed and any control information (such as timing) necessary to aid the Sense Transport Unit in receiving the information. The Sense Transport unit is also coupled to the Sense Operation Unit 1650, via path 1674.

The Precharge Transport Unit 1642 in FIG. 16 is coupled to external connections 1634 to receive precharge information 1612. The precharge information comprises a field to specify the device and the bank to precharge and any necessary control information. Precharge Transport Unit 1642 is also coupled to Precharge Operation Unit 1652 via path 1676.

The Close Transport Unit 1644 in FIG. 16 is coupled to external connections 1632 to receive close information 1614. The close information comprises a field to specify the device and the bank to close. In FIG. 16, the Close Transport Unit 1644 may be coupled via path 1678 to either the Close Operation Unit 1653 or to the Precharge Operation Unit 1652, depending on the capabilities of the memory core 1670 to support both a precharge and a close operation concurrently. In some embodiments, if the memory core is unable to support this concurrent operation, the Close Transport Unit 1653 is coupled to the Precharge Operation Unit 1642.

The Write Transport Unit 1646 in FIG. 16 is coupled to external connections 1630 to receive write information 1616. The write information comprises a field to specify a device, a field to specify the bank, and a field to specify the column address, indicating a set of sense amplifiers to be accessed for writing. Write (data) 1620 received by the Write Data Transport Unit 1664 completes the necessary fields for writing. In some embodiments, a write mask may be supplied. This is denoted by the braces surrounding the mask field in the figure. The function of the mask field is to disable certain portions of the data in the Write (data) 1620 from being written to the specified column address in the write information field, leaving that portion unchanged. The Write Transport Unit 1646 is also coupled to the Write Operation Unit 1656 via path 1675.

Read Transport Unit 1648 in FIG. 16 is coupled to external connections 1628 to receive read information 1618. The read information comprises a field to specify the device, a field to specify the bank and a field to specify a column address for reading. Read (data) 1622 is transported by Read Data Transport Unit 1666 to external connections 1624 and completes the necessary fields for reading. Read Transport Unit 1648 is also coupled to Read Operation Unit 1658 via path 1677.

Write Data Transport Unit 1664 in FIG. 16 is coupled to external connections 1626 to receive Write (data) 1620 in connection with write information 1616. Write Data Transport Unit 1664 has a separate set of external connections so the write data may be received earlier, at the same time as or later than the write information 1616. Write Data Transport Unit 1664 is also coupled to Write Data Operation Unit 1660 via path 1673.

Read Data Transport Unit 1666 in FIG. 16 is coupled to external connections 1624 to receive Read (data) 1622 in connection with read information 1628. Read Data Transport Unit 1666 has a separate set of external connections for transmitting Read (data) when the data is available, usually at a time later than the receipt of the read information 1618. Read Data Transport Unit 1666 is also coupled to Read Data Operation Unit 1662 via path 1675.

Memory Core 1670 in FIG. 16 has two sections, the Inner Core 1672 corresponding to all the blocks in FIG. 1, except for the column amplifiers, and column amplifiers 1678. The memory core is coupled via a separate pathway 1690 for write data and a separate pathway 1692 for read data. In FIG. 16, write data pathway 1690 is coupled via the column amplifiers 1678 to the inner core by pathway 1700. Read data pathway 1702 from the inner core is coupled to read data pathway 1692 via column amplifiers 1678. This allows read and write column operations to be concurrent. Memory core 1670 in FIG. 16 may be capable of performing concurrent column operations to support the concurrent read and write column operations.

As discussed above, individual operation units are coupled to the memory core or to another operation unit and are present to carry out a specified function. The Sense Operation Unit 1650 is coupled to the Sense Transport Unit 1640 and via path 1684 is coupled to the memory core 1670. The function of the Sense Operation Unit is to provide the needed information and timing to cause the memory core to complete a sense operation. In one embodiment, the Sense Operation Unit generates the information and timing according to FIG. 4 for a memory core similar to the memory core shown in FIG. 1. Thus for that embodiment, path 1684 carries SNSBANKADDR 432 and SNSROWADDR 422 shown in FIG. 4 and control signal SENSE 442. Both SNSBANKADDR 432 and SNSROWADDR 422 are derived from information received by the Sense Transport Unit 1640.

Precharge Operation Unit 1652 is coupled to the Precharge Transport Unit 1642 and via path 1686 is coupled to the memory core 1670. The function of the Precharge Operation Unit is to provide the needed information and timing to cause the memory core to complete a precharge operation. In one embodiment, Precharge Operation Unit 1652 generates information and timing according to FIG. 4. In that embodiment, path 1686 carries address signals PCHBANK 452 and control signal PRECH 462. This information has been derived from the information received from the Precharge Transport Unit 1642.

Close Operation Unit 1653 performs the same function as the Precharge Operation Unit 1652 but needs to exist as a separate resource to implement the precharge function at the end of the universal sequence. In another embodiment, Precharge Operation Unit 1652 is designed to carry out the function of the Close Operation Unit and receives its information from the Close Transport Unit 1644 via path 1693.

Write Operation Unit 1656 helps to carry out the function of writing data to the memory core. Write Operation Unit 1656 is coupled to the memory core 1670 via path 1680 and in one embodiment generates the timing and information signals according to FIG. 8. In that embodiment, path 1680 carries COLADDR signals 840, WMASK signals 832, the COLLAT signal 844, the COLCYC signal 846 and the WRITE signal 824. The COLADDR and WMASK signals are derived from the information fields received by the Write Transport Unit 1646. Write Transport Unit 1646 informs Write Operation Unit 1656 to begin the column write sequence.

Read Operation Unit 1658 helps to carry out the function of reading data from the memory core. Read Operation Unit 1658 is coupled to the memory core 1670 via path 1682 and in one embodiment generates the timing and information signals according to FIG. 7. In that embodiment, path 1682 carries COLADDR signals 740, the COLLAT signal 744, the COLCYC signal 746 and the WRITE signal 724. Write Data Operation Unit 1660 provides the write data information received by the Write Data Transport Unit 1664 to the column amplifiers on path 1690. Column amplifiers 1678 forward the write data to the inner core 1672 via path 1674.

Read Data Operation Unit 1662 receives the read data information obtained from the column amplifiers 1678, which forward the information received from the bit lines of the inner core via path 1676. Read Data Operation Unit 1662 then provides the data for the Read Data Transport Unit 1666.

Figure 17:
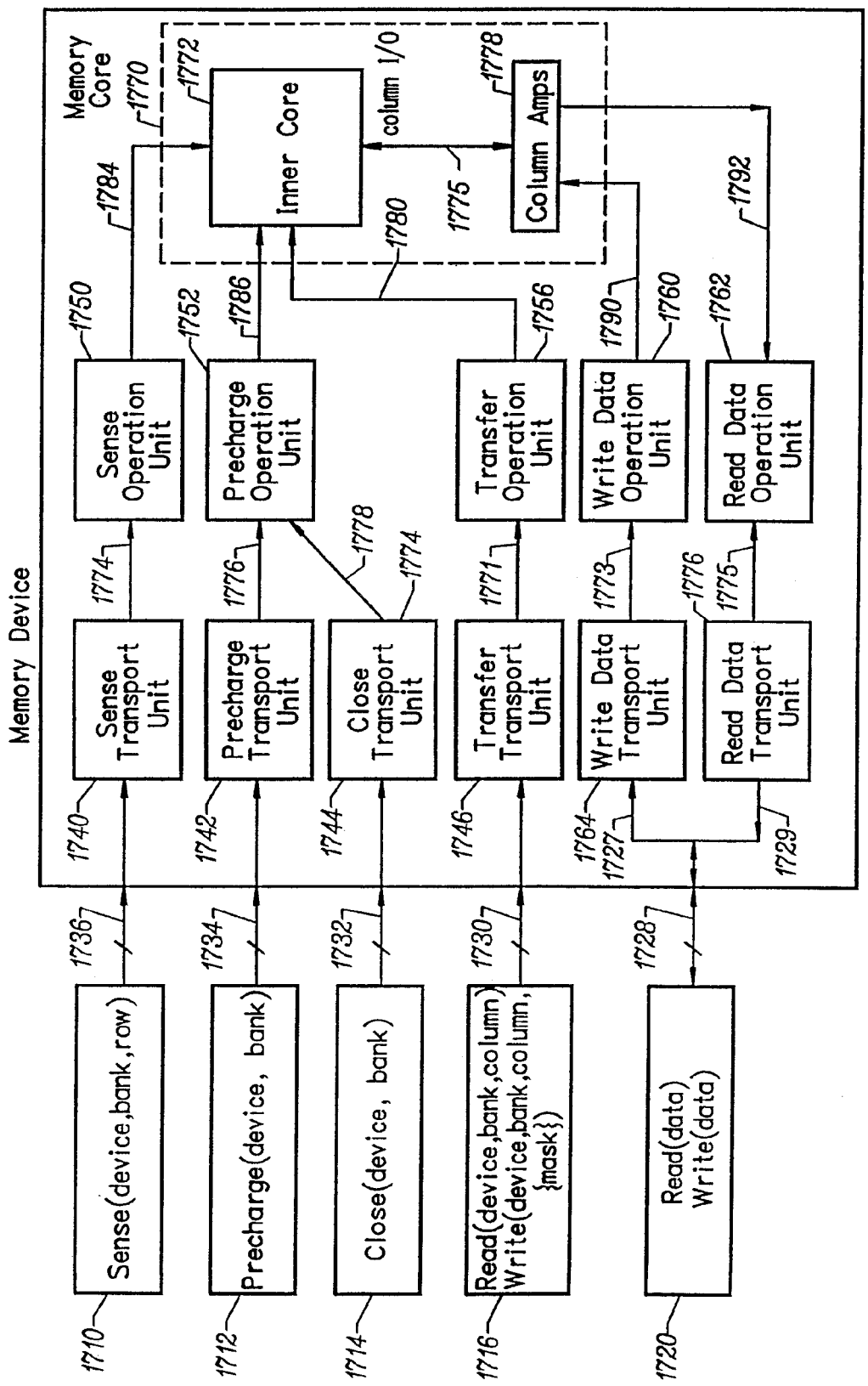
FIG. 17 illustrates a memory device constructed in accordance with an embodiment of the invention.

FIG. 17 shows an alternate embodiment according to the present invention. In this embodiment, Close Transport Unit 1744 is coupled to Precharge Operation Unit 1752 which for some transactions may cause a resource conflict in a single device. Multiple devices may fully utilize the capabilities of the interconnect 1732. However, in this embodiment, a simpler memory device is the goal. Also in the embodiment of FIG. 17, the read data path and write data paths between the inner core 1772 and the column amplifiers 1778 are combined into path 1775. This cuts down on the number of connections between the column amplifiers and the inner core. However, paths 1790 and 1792 are still kept separate so that back-to-back read/write operations at the core are possible. In FIG. 17 a single path 1728 external connection is shown over which both read and write data are transported, precluding the transporting of read and write data concurrently. Read Transport Unit and Write Transport Unit functions are combined into the Transfer Transport Unit 1746. This unit now receives either the read or write information fields 1716 on external connection 1730. Another effect of bidirectional external connection 1728 and bidirectional path 1775 is that there is a time gap on the external connections 1728 switching from a sequence of writes to a sequence of reads due to the fact that the memory core in the embodiment of FIG. 17 cannot perform concurrent column operations. This limitation does not exist in an embodiment of the present invention according to FIG. 16. In the case of multiple devices, full use of the external connections 1728 is possible.

Figure 18:
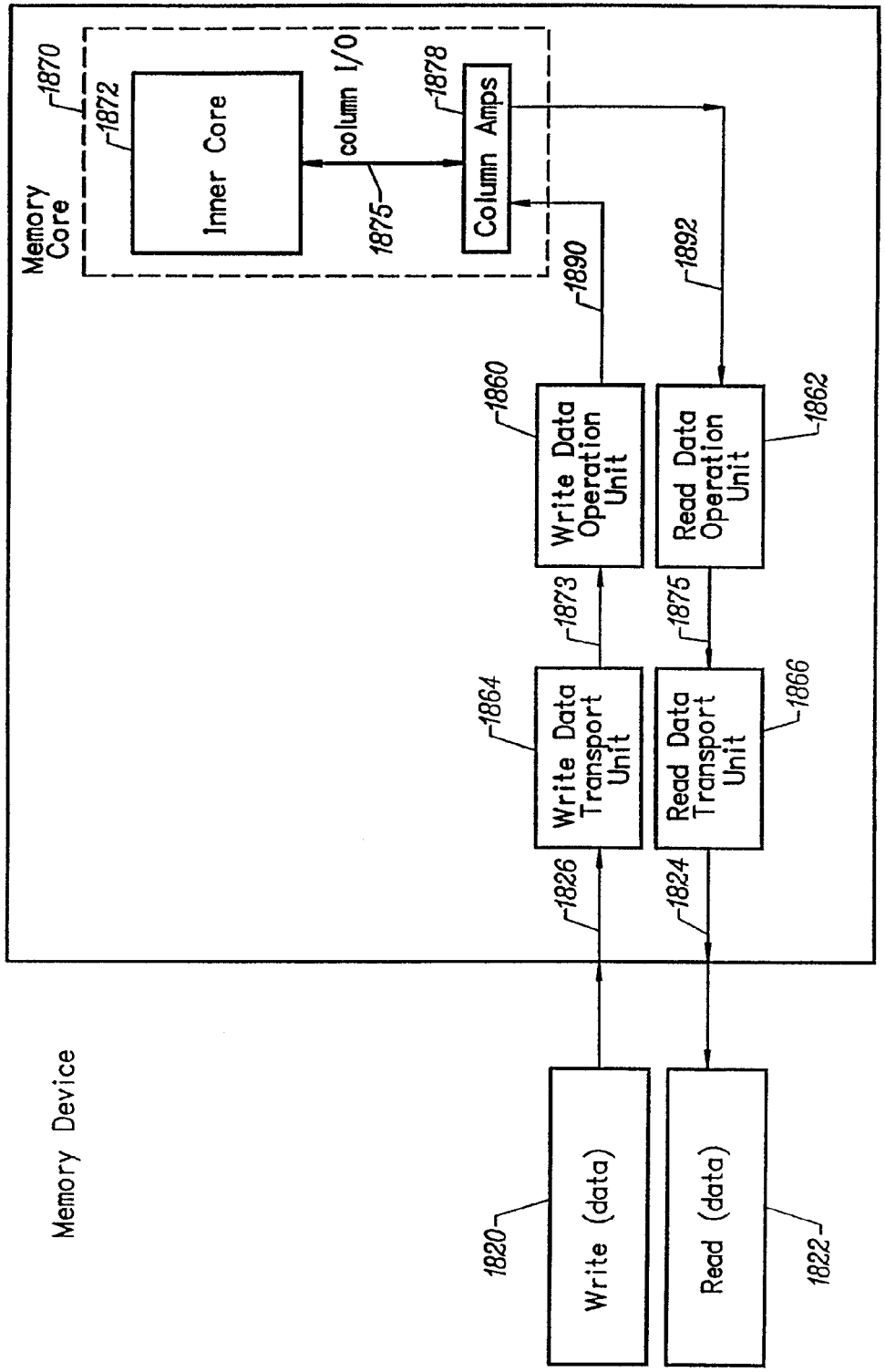
FIG. 18 illustrates a memory device constructed in accordance with an embodiment of the invention.

FIG. 18 shows an alternative embodiment according to the present invention in which the external connections for read and write data paths 1824 1826 are separate and unidirectional, but the column I/O path 1875 is bidirectional. This configuration allows read and write data to be available at the column amplifiers 1878 for back-to-back read/write core operations because there are no timing conflicts in the paths leading to the column amplifiers. For example, write data 1820 may be made available on path 1890 to the column amplifiers as soon as read data on path 1892 has been obtained from the column amplifiers permitting the immediate next memory core column cycle to be used.

Figure 19:
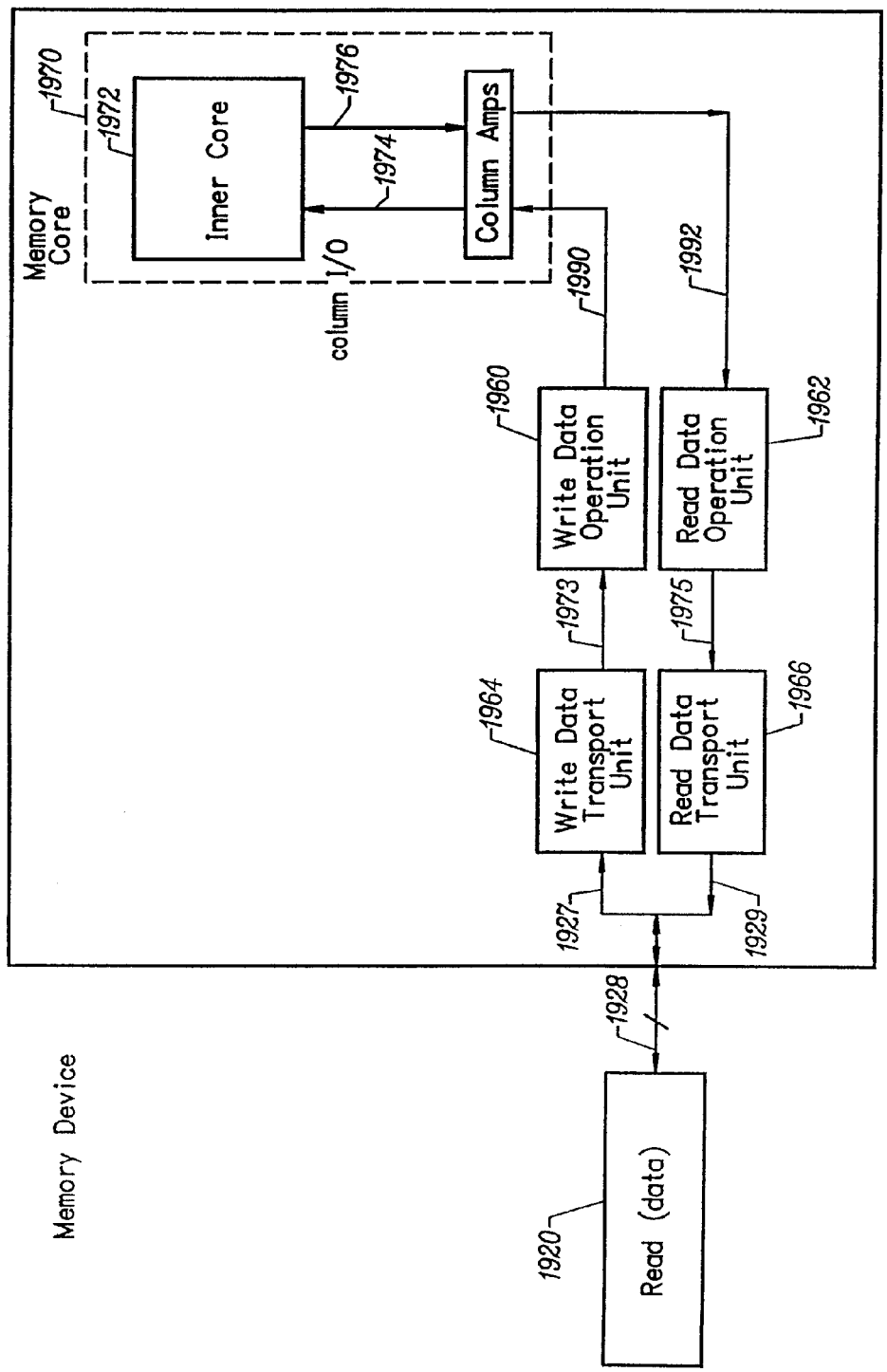
FIG. 19 illustrates a memory device constructed in accordance with an embodiment of the invention.

FIG. 19 shows an alternative embodiment according to the present invention for supporting back-to-back memory core read/write cycles. In this configuration, there is a bidirectional path 1928 for the external read or write data 1920. However, the Column I/O lines 1974, 1976 are unidirectional and separate. This configuration allows, for example, write data 1920 to arrive at the memory core while a read column cycle is in process. A memory core capable of concurrent column operations starts a second column cycle concurrent with the read cycle, thus overlapping the two column cycles, thus maintaining high external connection 1928 utilization and high memory core utilization.

Figure 20:
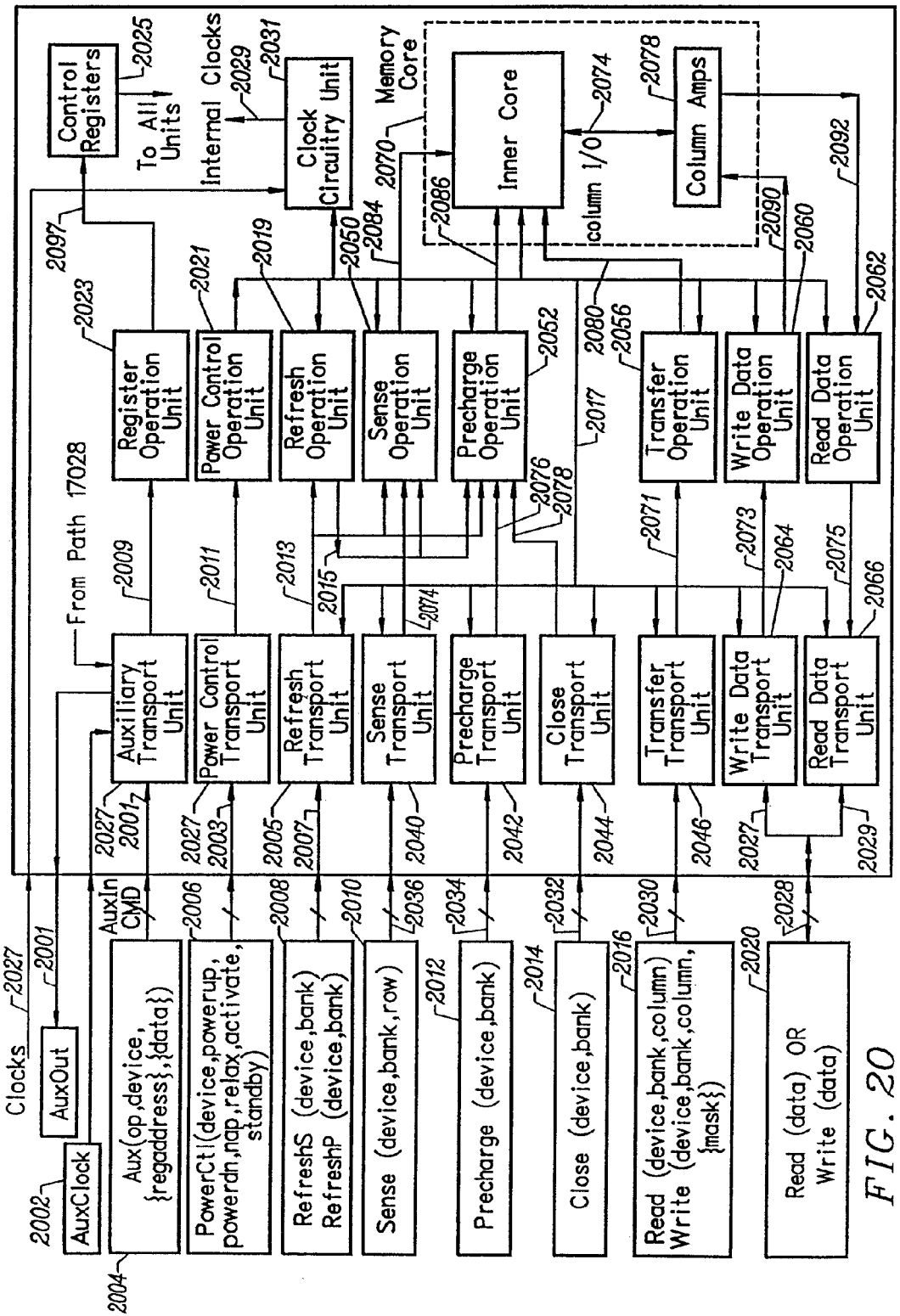
FIG. 20 illustrates a memory device constructed in accordance with an embodiment of the invention.

FIG. 20 shows another embodiment according to the present invention. In this embodiment, several resources have been added. They are the Refresh Transport Unit 2005, the Refresh Operation Unit 2019, the Power Control Transport Unit 2027, the Power Control Operation Unit 2021, the Auxiliary Transport Unit 2027, the Register Operation Unit 2023, the Control Registers 2025 and the Clock Circuitry 2031.

In FIG. 20, Refresh Transport Unit 2005 receives refresh information from external connections 2007 that instructs the specified memory device to perform either a refresh-sense operation or a refresh-precharge operation on a specified bank. These operations are required for dynamic memory cores whose storage cells need low frequency periodic maintenance to counteract the long term loss of charge on the cells. Refresh Transport Unit 2005 is coupled to Refresh Operation Unit 2019, to Sense Operation Unit 2050 and to Precharge Operation Unit 2052 via path 2013. Thus, the Refresh Transport Unit uses the Sense Operation Unit 2050 and Precharge Operation Unit 2052 to carry out any refresh sense or precharge operation that is required. Refresh Operation Unit 2019 is also coupled to the Sense Operation Unit 2050 and the Precharge Operation Unit 2052 via path 2015 to provide the row address necessary for the refresh-sense operation. This row address is incremented after a refresh operation by the Refresh Operation Unit. Refresh Operation Unit 2019 is also responsible for providing refresh to the memory core when the memory device is in a low power state. This refresh is referred to as self-refresh.

Figure 21:
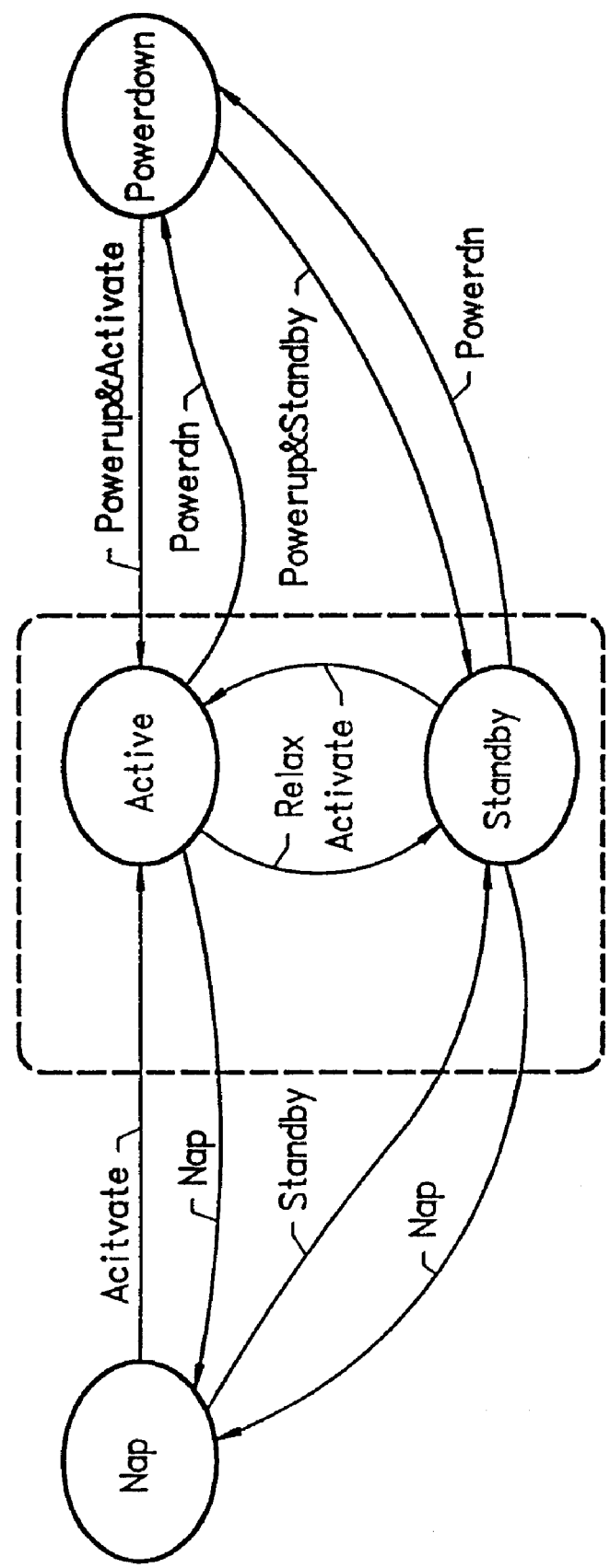
FIG. 21 illustrates a state diagram depicting operations in accordance with an embodiment of the invention.

In FIG. 20, Power Control Transport Unit 2027 receives power control information from external connections 2003. Power control information specifies changes to the power state of the memory device. In one embodiment according to the present invention, the power states of the device in order of power consumption are Powerdown (least power), Nap, Standby and Active (most power). Standby means the memory device is ready to receive information from external connections because circuitry in the Clock Circuitry Unit has not enabled full speed operation. Active means the memory device is ready to receive information from the external connections and to operate at full speed. Power control information 2006 which is received on external connections 2003 has a set of fields that specify the change to the state. The powerup, activate and standby fields specify that the memory device move to either the standby or active state from the Powerdown state. The powerdown field specifies that the memory device move to its power down state. The nap field specifies that the memory device move into the nap state from which it may only return to the standby or active state, depending upon the activate and standby fields. The relax field specifies that the memory device move from the active state to a standby state, and the activate field specifies that the memory device move from a standby state, nap or powerdown state to an active state. These states and the transitions between them are shown in FIG. 21. The Power Control Operation Unit 2021 is coupled to the Power Control Transport Unit 2027 via path 2011 and carries out the changes in power state by acting upon some or all of the other units and the memory core within the device via path 2017.

Referring again to FIG. 20, the Auxiliary Transport Unit receives auxiliary information from external connections 2001 which include connection AuxIn. In one embodiment according to the present invention, auxiliary information specifies such operations as clearing parts of the control register, setting the clock mode for the clock circuitry unit 2031, and reading and writing the control registers 2025. In one embodiment according to the present invention, the Auxiliary Transport Unit, itself not needing initialization, aids in the initialization of the memory device after a reset operation by receiving information from the AuxIn external connection and passing it through to the AuxOut external connection 2001. Auxiliary Transport Unit is coupled to Register Operation Unit 2023 which in turn is coupled to the Control Registers 2025 via path 2097 to support the operations of resetting and reading and writing the control registers. Control Registers 2025 connect to some or all of the units within the memory device to affect or modify some or all of the functions of the units.

In FIG. 20, Clock Circuitry Unit 2031 is coupled to the Power Control Operation Unit 2021, the Control Registers 2025 and to the external clocks received from path 2027. The Clock Circuitry Unit 2031 drives the internal clocks 2029 to the other units within the device. In one embodiment according to the present invention, the functions of the Clock Circuitry Unit 2031 are to receive and buffer the external clock and provide skew compensation by means of delay locked or phase locked circuitry for the external clock so that the internal clocks 2029 have a controlled phase relationship with the external clocks 2027.

Figure 23:
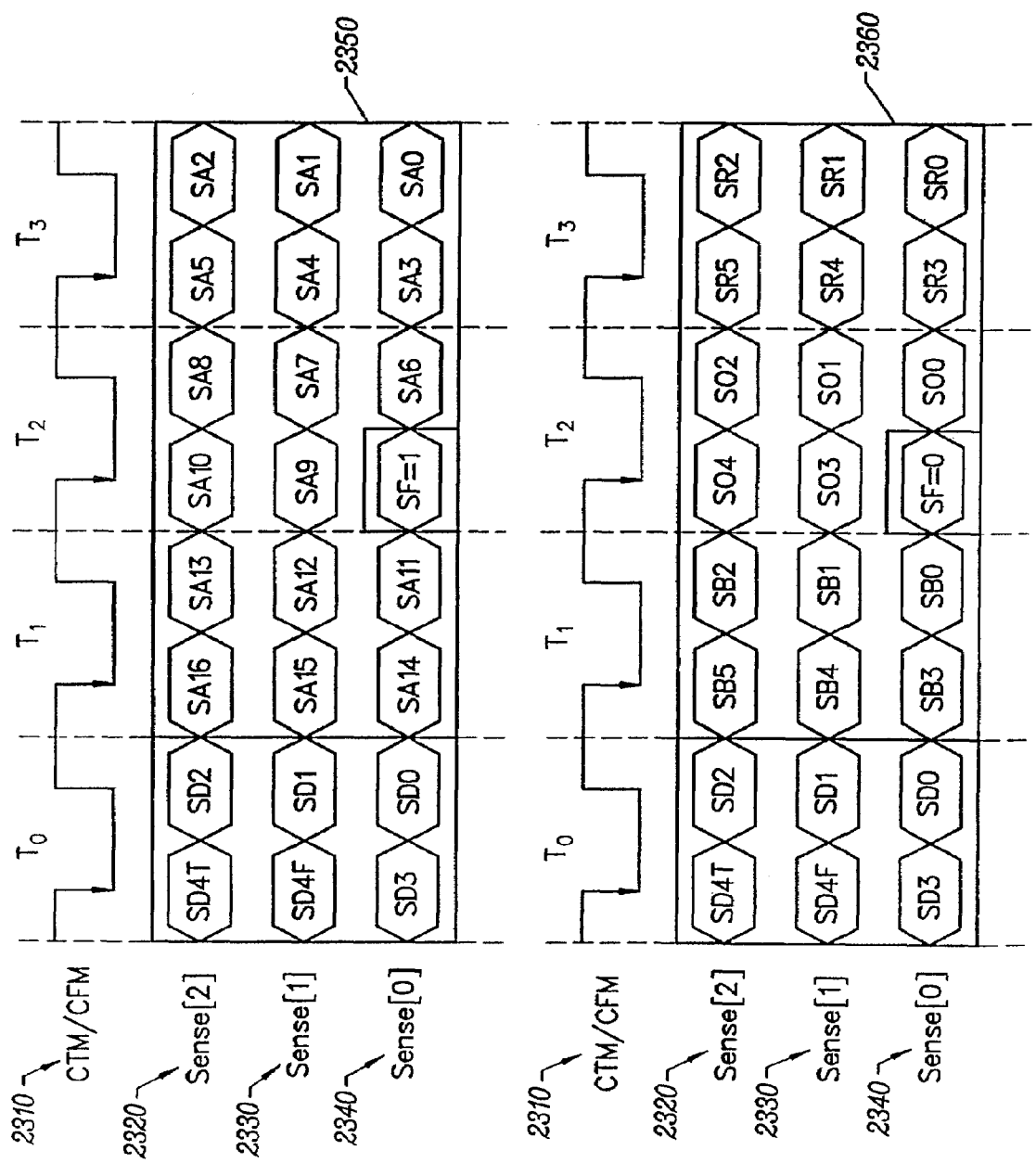
FIG. 23 illustrates memory access operations in accordance with an embodiment of the invention.

According to an embodiment of the present invention, the memory device of FIG. 20 has sense information fields 2010 encoded in the format shown in FIG. 23. In FIG. 23, signals CTM and CFM 2310 are the external clocks 2027 in FIG. 20. Signals Sense[2] 2320, Sense[1] 2330 and Sense[0] 2340 contain encoded sense information as it is received in time by the Sense Transport Unit of FIG. 20. In particular in packet 2350, the SD[4:0] field specifies the device address. The SD[4:0] field selects a memory device out of a total of 32 devices. The SF bit controls whether the Sense[2:0] information is interpreted according to the fields in packet 2350 or the fields in packet 2360. The SA field specifies the bank and row for the sense operation. In an embodiment having 64 banks, the SA field specifies one of 2048 rows in a bank. Field SB[5:0] specifies the bank address for the packet in 2360 and field SO[4:0] specifies other operation information that may be required in some embodiments. For example, in an embodiment according to the present invention, it is desirable to specify the power control operations 2006 on the external sense connections 2036 in FIG. 20. Sense packet 2350 or 2360 each contain a total of 24 bits of information which fully specify the sense operation, the bits shown being transported in both phases of the external clock.

Figure 24:
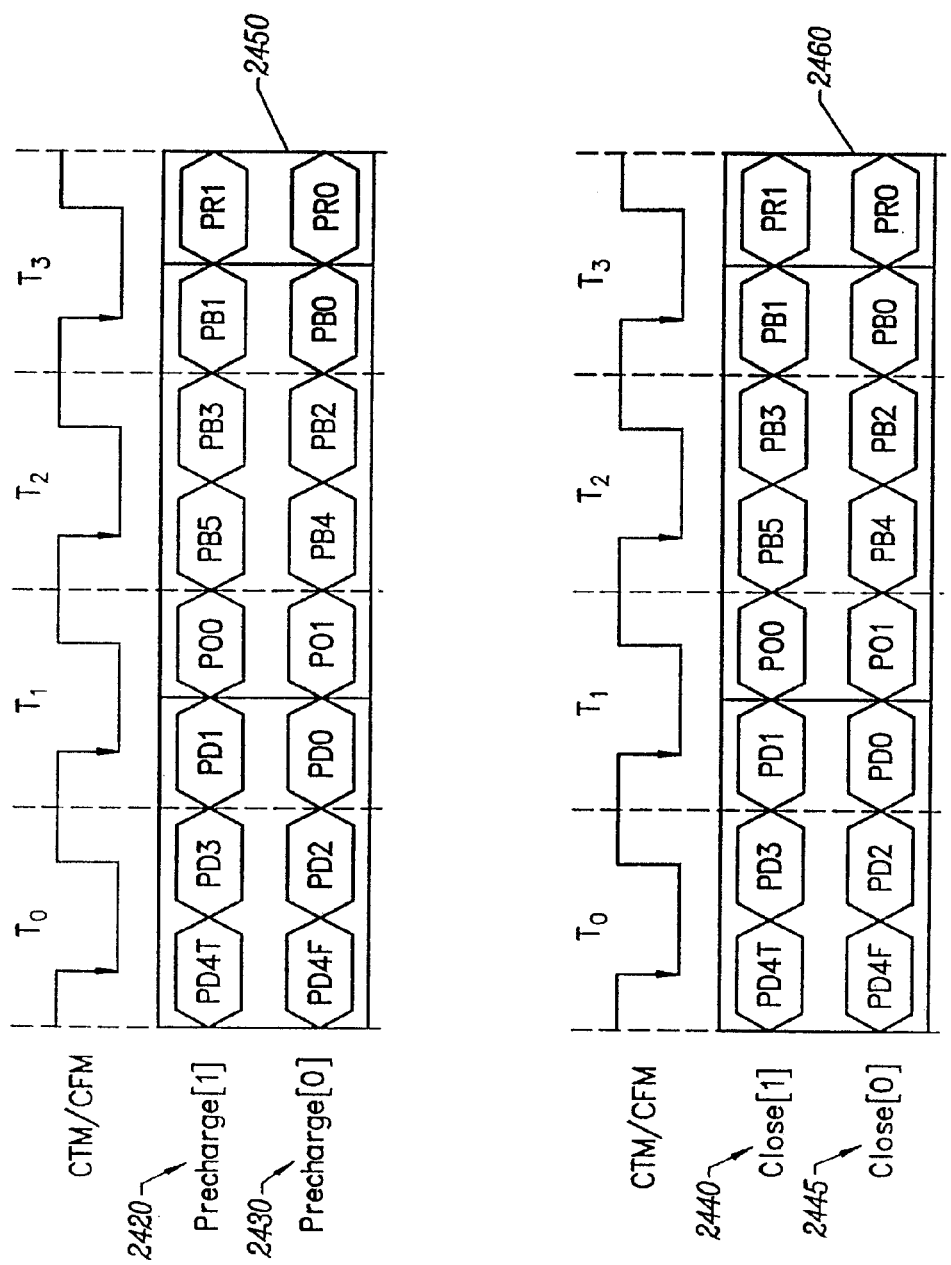
FIG. 24 illustrates memory access operations in accordance with an embodiment of the invention.

According to an embodiment of the present invention, the memory device of FIG. 20 has a precharge information field 2012 encoded in the format shown in FIG. 24. Signals Precharge [1] 2420 and Precharge [0] 2430 have the following encoded information. Field PD[4:0] specifies one of 32 devices targeted to receive the precharge information and again the field includes PD4T and PD4F for framing of the packet and broadcasting to multiple devices. The PO [1:0] field specifies the precharge operation and other operations if desired, such as power control information. Field PB [5:0] specifies one of 64 banks to be precharged and PR [1:0] is a reserved field. Precharge packet 2450 contains a total of 16 bits fully specifying the precharge operation, the bits shown being transported in both phases of the external clock. Close Packet 2460 has the same encoding as the precharge packet and requires another 16 bits, which fully specify the close operation.

Figure 25:
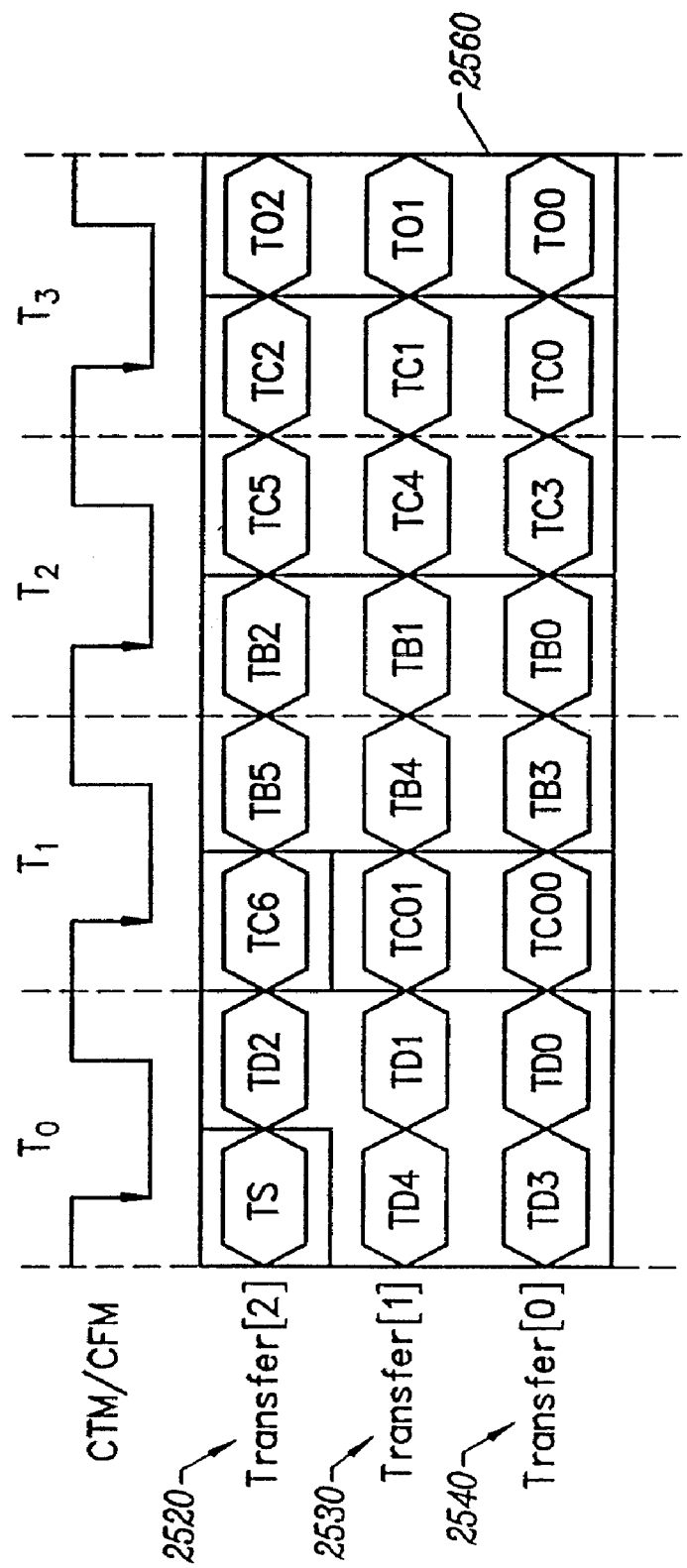
FIG. 25 illustrates memory access operations in accordance with an embodiment of the invention.
Figure 26:
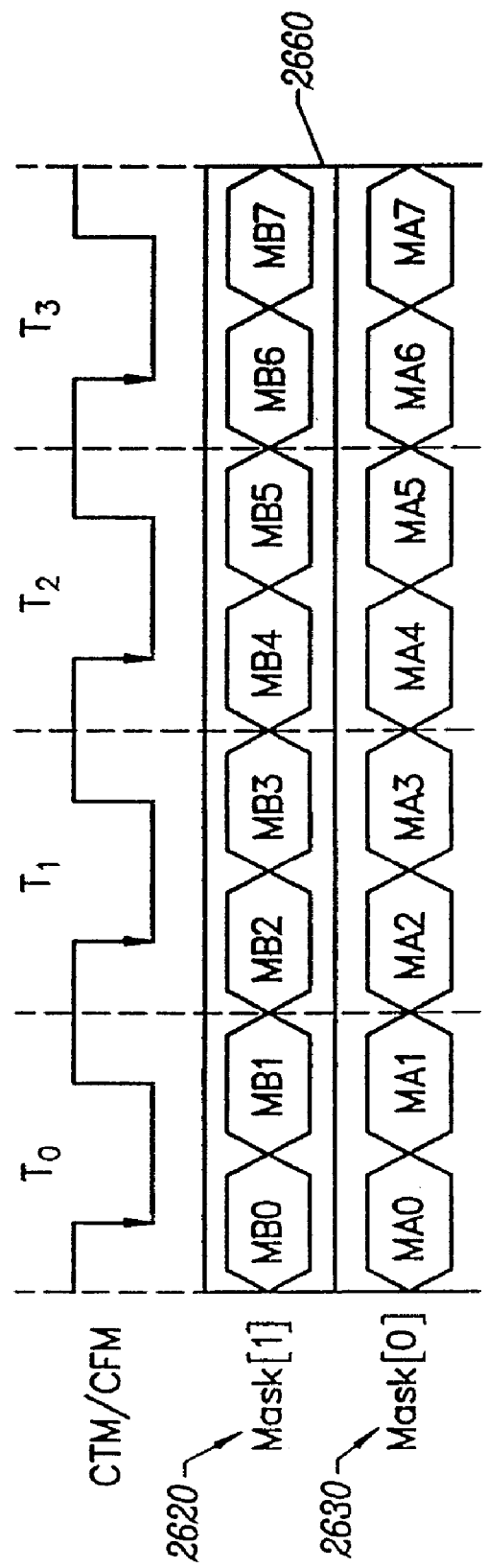
FIG. 26 illustrates memory access operations in accordance with an embodiment of the invention.

According to an embodiment of the present invention the memory device of FIG. 20 has transfer information field 2016 encoded in the format shown in FIG. 25. Signals Transfer [2] 2520, Transfer [1] 2530 and Transfer [0] 2540 have the following encoded information. Field TS is a framing bit to indicate the start of the packet 2560. Field TD[4:0] specifies the device targeted for the transfer. Field TCO [1:0] specifies the transfer operation such as a read, write or noop. Field TB [5:0] specifies one of 64 banks for the transfer operation and field TC [6:0] specifies one of 128 column addresses for the transfer operation. Finally, field TO [1:0] specifies other information such as power control information in some embodiments. In an embodiment according to the present invention, the transfer packet 2560 fully specifies the transfer operation rather, for example, than using information from a sense packet. FIG. 26 shows the mask that may accompany the transfer packet when the TCO field specifies a write operation. Signals Mask [1] 2620 and Mask [2] 2630 in mask packet 2660 have the following encoded information. Field MA [7:0] specifies 8 bits of byte masks for controlling the writing of eight bytes. Field MB [7:0] specifies 8 bits of byte masks for controlling writing of a separate set of eight bytes. Thus, byte masks for a total of sixteen bytes are specified, requiring a total of 16 bits.

Figure 27:
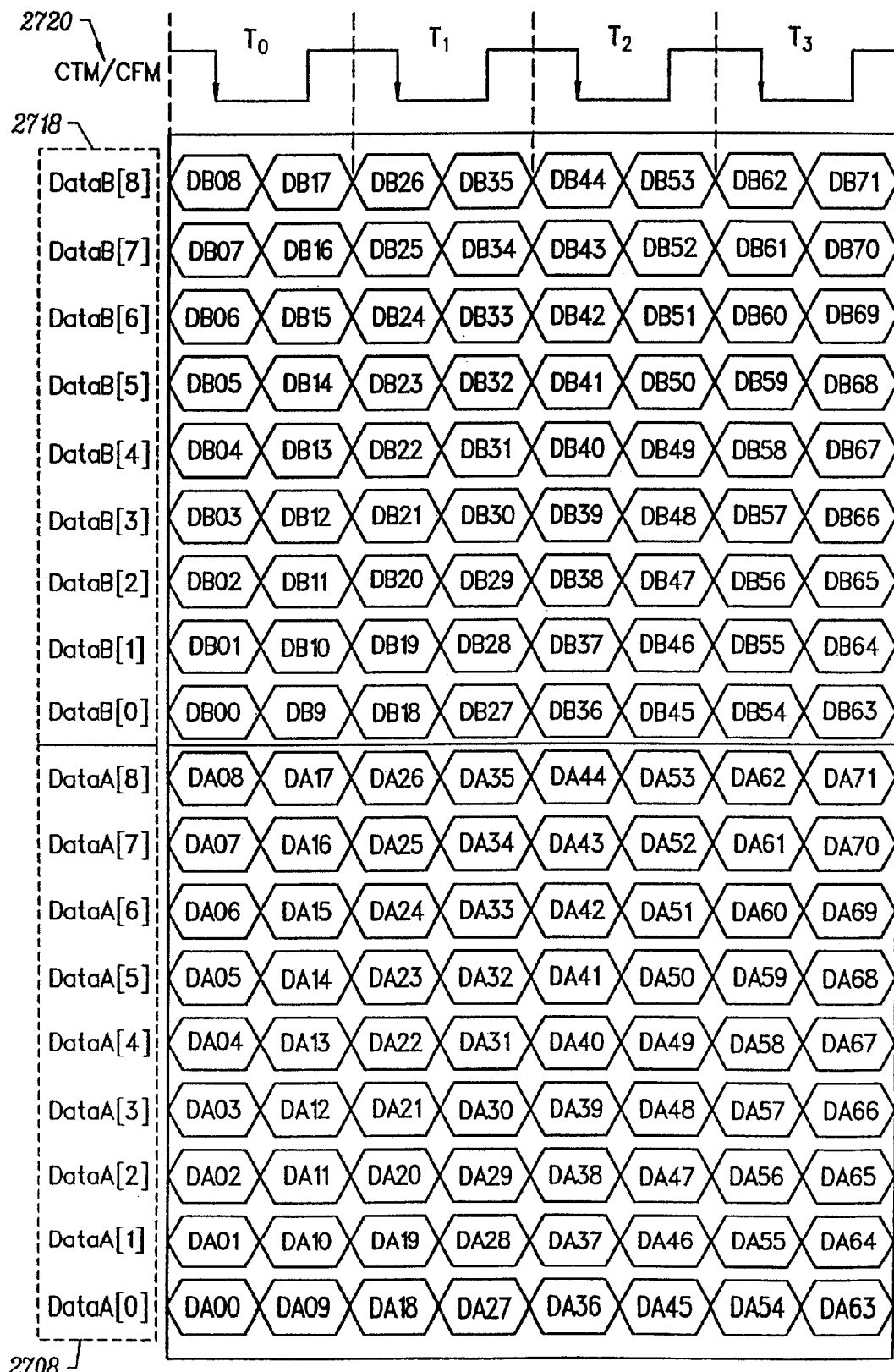
FIG. 27 illustrates memory access operations in accordance with an embodiment of the invention.

According to an embodiment of the present invention, the memory device of FIG. 20 has transfer data field 2020 encoded in the format shown in FIG. 27. Signals DA [8:0] 2708 and DB [8:0] have encoded in them a data packet with data bits DAOO to DA71 and DBOO to DB71 for a total of 144 bits transferred in a column operation. Mask packet field MB [7:0] applies to the DB00 to DB71 with MB0 controlling the masks for DB00 to DB08 and so on. Mask packet field MA [7:0] applies to DA00 to DA71 with MA0 controlling masks for DA00 to DA08 and so on. Thus, each mask bit controls whether a set of nine data bits is written. It should be noted that the data is transported on both phases or edges of the external clocks 2027 in FIG. 20 and 2720 in FIG. 27.

Thus, given the packets described above, a memory device according to an embodiment of the present invention has 64 banks, 2048 rows per bank, and 128 data packets per bank. Given the size of the data transfer field encoded in the format shown in FIG. 27, a single memory device according to the above packets has a capacity of 224 data packets, each of which is 144 bits for a total capacity of 288 Megabytes (2.304 Gigabits). Those skilled in the art will understand how to expand various field sizes as needed for larger capacity devices.

Figure 28:
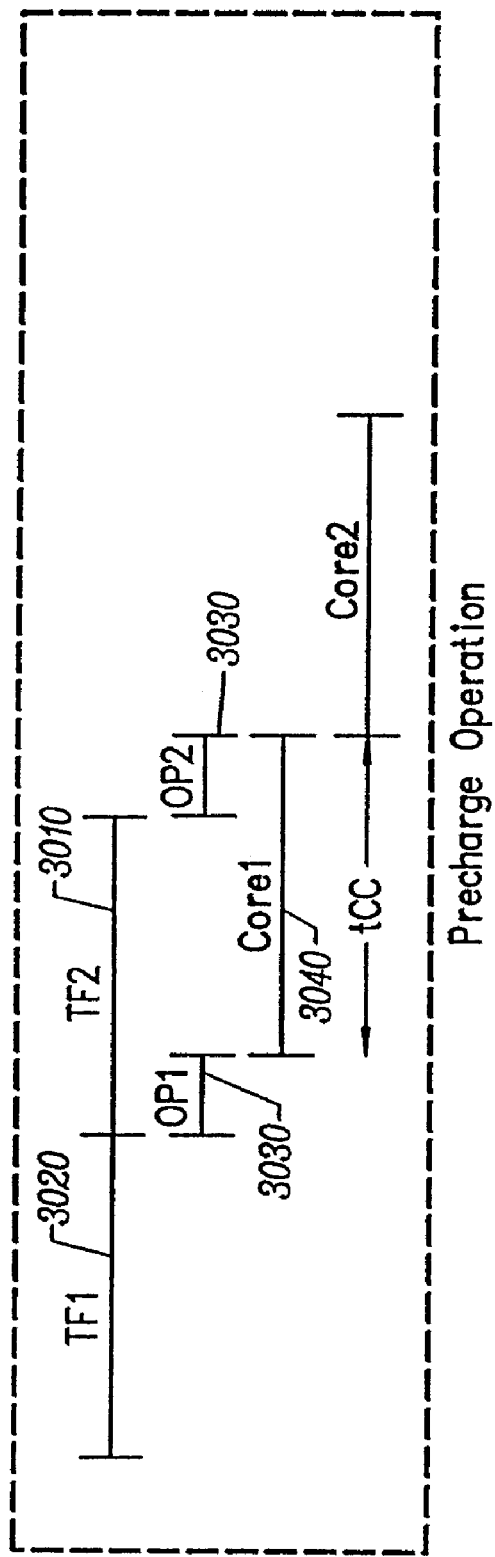
FIG. 28 illustrates precharge operation in accordance with an embodiment of the invention.

FIG. 28 illustrates transport and operation unit timing. FIG. 28 shows the relative timing of the Precharge Transport Unit 2042 and Precharge Operation Unit 2052 of FIG. 20 for a precharge operation. In the timing diagram, time interval TF1 represents the amount of time required for the Precharge Transport Unit 2042 to collect the precharge information according to the format of the precharge packet 2450 in FIG. 24. After the precharge packet is collected, it is forwarded to the Precharge Operation Unit which operates to send the address and control signals according to the timing of FIG. 4 to the memory core during time interval OPT. According to the timing diagram of FIG. 28, this takes a smaller time than the TF1 interval. After interval OP1 ends, the memory core precharges the selected bank and row, which is denoted by time interval Core_1. As shown in the diagram, after the Precharge Transport Unit receives the first precharge packet during TF1, it receives second precharge packet during TF2. The second precharge packet may specify a precharge operation for a different bank and row than the first precharge packet. The second precharge packet is serviced by the Precharge Operation Unit to cause the memory core to begin another precharge operation after an interval tCC. This requires that the memory core be capable of having precharge operations to different banks, subject to the restriction shown in timing diagram of FIG. 5 that the second precharge operation on the core occur no sooner than tPP. If the time between successive precharge operations is too small, thus violating timing parameter tPP, the device sending the precharge packet may delay the transport of the second packet.

If the second precharge packet specifies a different device rather than a different bank within the same device, then the timing parameter tPP does not apply.

In the case of multiple dependent banks, a second precharge packet specifying a dependent bank relative to the first precharge packet is considered a precharge to the same bank and must meet timing parameter tRC for a conventional memory core.

Figure 29:
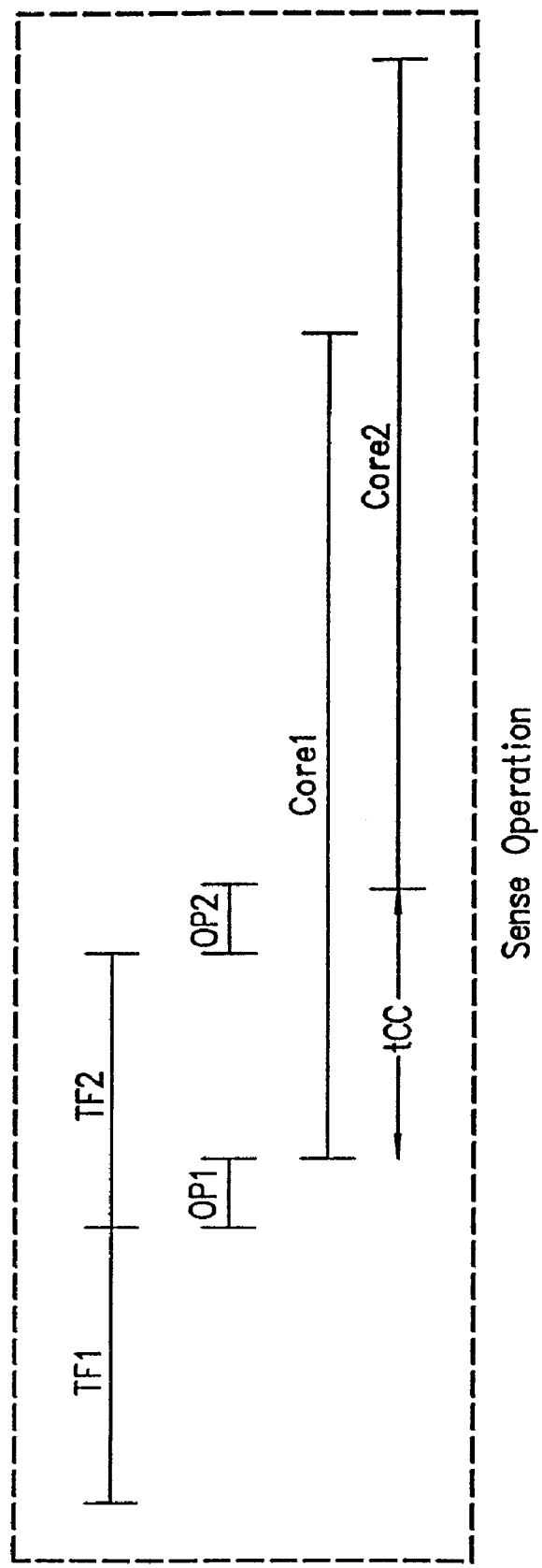
FIG. 29 illustrates a sense operation in accordance with an embodiment of the invention.

FIG. 29 shows a sense operation carried out by the Sense Transport Unit and Sense Operation Unit. During TF1 the first sense packet is collected by the Sense Transport Unit 2040 in FIG. 20. Next, Sense Operation Unit 2050 receives the sense information and starts the sense operation in the memory core 2070, which is shown as time interval Core1 in FIG. 29. A second sense packet may be collected during TF2 and a second sense operation started during OP2 by the Sense Operation Unit 2050. Again, if the second sense packet is to a different bank within the same device, time tCC must meet or exceed timing parameter tSS in FIG. 5. For this case, the memory core must be capable of two concurrent sense operations to different banks. If the second sense packet is to a different device, then tSS does not apply. If the second sense packet is to a dependent bank relative to the first sense operation, then tRC applies as for a conventional memory core.

Figure 30:
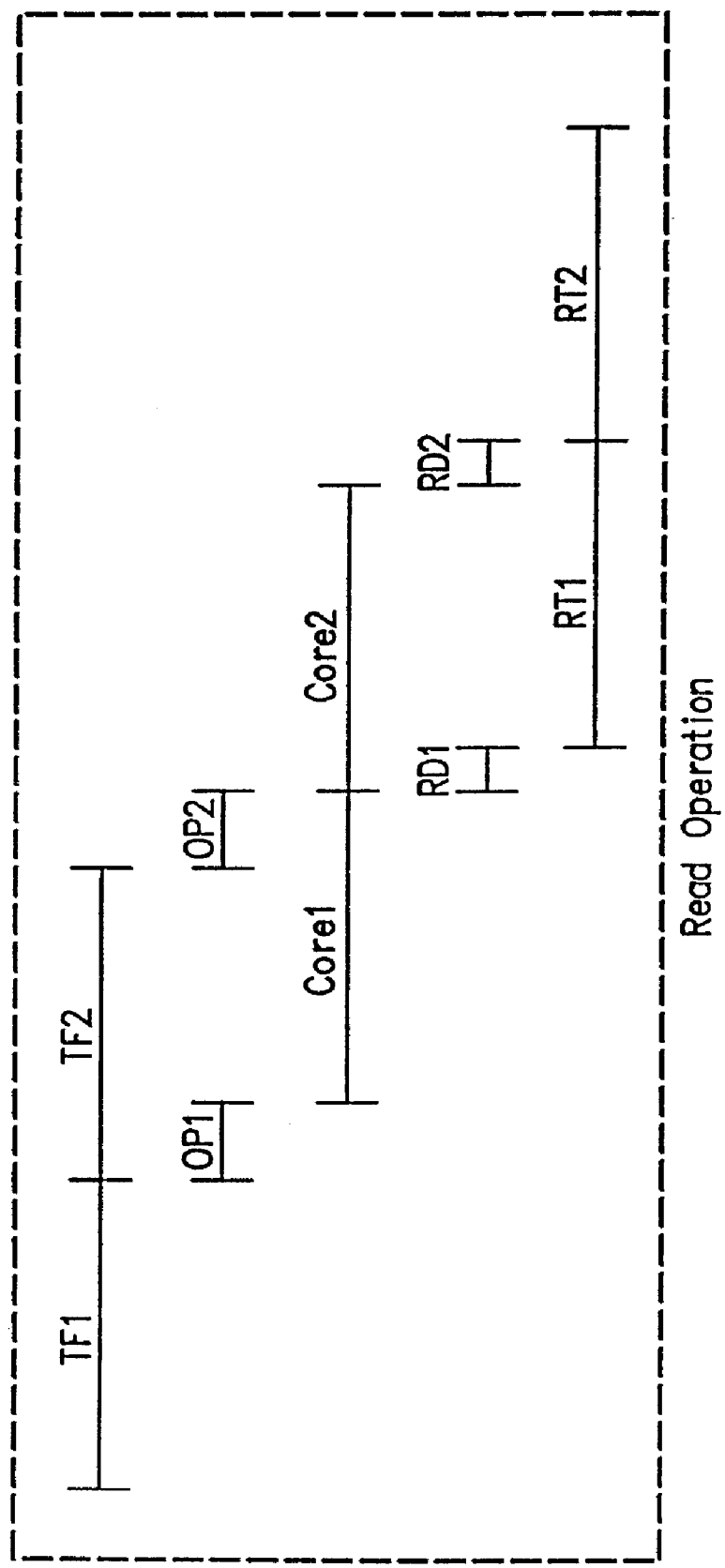
FIG. 30 illustrates a read operation in accordance with an embodiment of the invention.

FIG. 30 shows a read operation carried out by the Transfer Transport Unit 2046 and the Transfer Operation Unit 2056 in FIG. 20. In the timing diagram, the transfer packet of FIG. 25 is collected by Transfer Transport Unit 2046 during time interval TF1. The transfer information is then forwarded to the Transfer Operation Unit 2056, which starts the memory core read operation during OP1 according to the timing diagram of FIG. 7. Memory core read operation occurs during the Core1 interval in FIG. 30. While the memory core 2070 is performing a read operation during Core1, a second transfer packet is received during TF2 and sent the Transfer Operation Unit 2056, which operates during OP2 to start a second read operation in the memory core. However, because a memory core cycle for a read operation is short, tPC being on the order of 10 ns, time interval Core1 is shown ending just as time interval Core2 starts. Upon the completion of the Core1 interval, the read data is obtained by the Read Data Operation Unit 2062 during RD1 and forwarded to the Read Data Transport Unit 2066. During RT1 the Read Data Transport Unit 2066 produces a data packet according to the timing diagram of FIG. 27.

To operate the pipeline shown in FIG. 30 so that there are no gaps in time on the data information connections 2028 in FIG. 20, the Core1 time interval is matched to the transport intervals TF1 for the transfer information and RT1 for the read data. In one embodiment according to the present invention, Core1 time is 10 ns, transport time TF1 is 10 ns and read packet time RTI is 10 ns. Thus, if the operations in FIG. 30 are sustained, the throughput of this embodiment is 144 bits/10 ns=1.8 GigaBytes per second.

Figure 31:
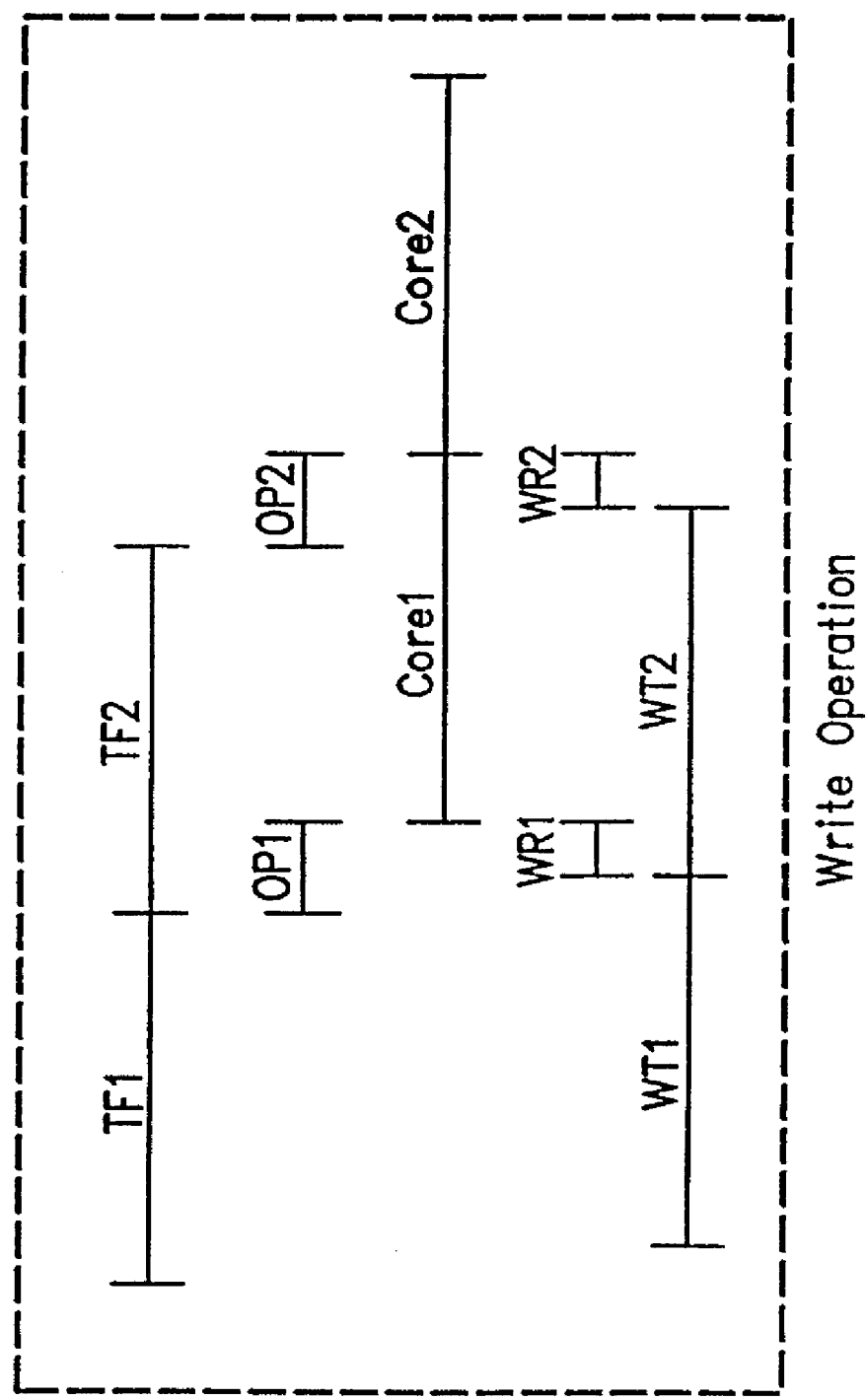
FIG. 31 illustrates a write operation in accordance with an embodiment of the invention.

FIG. 31 shows the case of a pipelined write operation according to an embodiment of the present invention. The write operation in FIG. 31 is similar to the read operation of FIG. 30 except that write data must arrive during the TF1 time interval to collect the transfer packet in the Transfer Transport Unit 2046 in FIG. 20. Thus, during WT1 the Write Data Transport Unit 2064 collects the write data information from external connections 2027 and forwards the data to the Write Data Operation Unit 2060. Write Data Operation Unit 2060 operates during WR1 to forward the data to the memory core. Transfer Operation Unit 2056 operates during OP1 according to the timing diagram of FIG. 8 to start a write cycle during time interval Core1. A second transfer packet arrives during TF2 and starts a second write operation during time interval Core2 using the data collected during time interval WT2. In one embodiment according to the present invention, the Core1 time is 10 ns and TF1, WT1, TF2, WT2 and Core2 are all the same as the Core1 time. In this embodiment, the pipeline can sustain data transfers on the external connections 2027 and the throughput is 144 bits/10 ns=1.8 Gigabytes per second.

Figure 32:
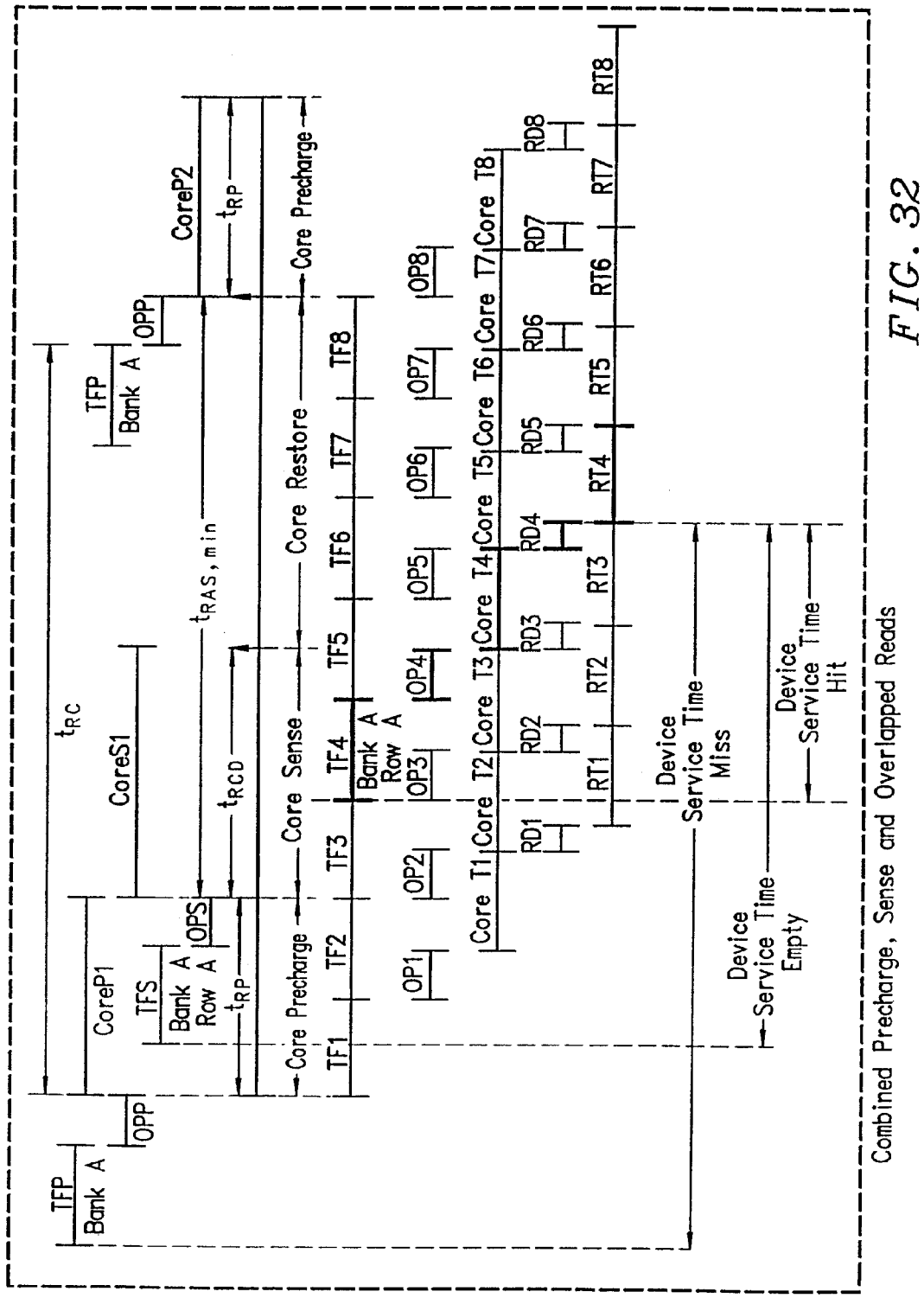
FIG. 32 illustrates combined precharge, sense, and overlapped read operations in accordance with an embodiment of the invention.

FIG. 32 shows a more complex case of a pipelined read operation, wherein a precharge and sense operation precede one of the read operations and a precharge succeeds one of the read operations. This timing diagram shows the important constraints that must be met for proper operation of the memory core. The timing constraints are the core precharge time tRP, core sense time tRCD, and core sense and restore time tRAS, min. Row cycle time tRC and column cycle time tPC also apply. In FIG. 30 core precharge and core sense operations pertain to a particular bank which is the target of the transfer packet collected during TF4.

In an embodiment according to the present invention, the memory device in FIG. 20, receives a precharge packet during TFP into the Precharge Transport Unit 2042. Precharge Operation Unit 2052 operates during OPP to start off a precharge operation during time interval Core1. During interval TFS, the memory device collects a sense packet. This occurs concurrently with the Core1 precharge. After TFS, the Sense Operation Unit 2050 operates to start a sense operation of Bank A, Row A during OPS. During CoreS1 the sense operation is carried out by Bank A, Row A. Meanwhile during CoreP1, transfer packets TF1, TF2, TF3 and TF4 are being received by the Transfer Transport Unit 2046. These transfers are targeted for banks other than BankA. After time tRP and tRCD, Bank A, RowA is open and ready to transfer data. The timing of TF4 is such that it has the Transfer Operation Unit 2056 ready to start a CoreT4 cycle to obtain the column data specified in TF4. The specified data is received into the Read Data Operation unit during RD4 and transported on the external connections during RT4 while Bank A, Row A is being restored. Finally, BankA, RowA is precharged during Core P2 and the cycle repeats. Assuming that the time for all transport and core cycles is the same, from FIG. 32 it can be seen that the transport units and the operation units are operating concurrently, but some times with an offset of less than the time for a transport time interval. This is accomplished by having the internal units in the memory device operate from a high frequency clock, such that there are a certain number of clock cycles within a transport or core cycle time. This fine granularity of time caused by the high frequency clock allows the transport and operation units to meet the timing requirements of the core with the granularity of a cycle of the high frequency clock. For example, in FIG. 32, core timing constraints may require that transport packet TF4 arrive a quarter of a TF4 time interval later. If this is required, TF1 through TFS must all shift by the same amount. This can occur if the high frequency clock cycle is a quarter of the TF4 time interval. In one embodiment according to the present invention, TF4 is 10 ns and the high frequency clock has a cycle of 2.5 ns. The ability to adjust timing with 2.5 ns accuracy also improves service time for a request.

In FIG. 32, three service times are shown. The first is the Device Service Time for the case of a miss, which means that a row other than the requested row was open in Bank A. Precharge cycle CoreP1 closed the open row and sense cycle CoreS1 opened the requested row. In an embodiment according to the present invention with a transport time interval of 10 ns, the service time for a miss is approximately 72 ns. The second is the device service time for the case of a closed bank, meaning that no row was open in the targeted bank. A sense operation during CoreS1 is required to open the row. For an embodiment having a transport time interval of 10 ns, the service time of the empty operation is approximately 52 ns. The third is the device service time for the case of a hit, which means that the targeted row was open and ready for a transfer. For an embodiment having a transport time interval of 10 ns, the service time of a hit is approximately 27 ns. These times are heavily dependent upon the particular memory core, as well as the frequency of the internal clock.

In FIG. 32, there is an assumption to sustain the pipeline for read transfers RT1 through RTS. The assumption is that transfer requests other than TF4 must not require a row other than the row in the bank required for TF4. If another transfer does require a different row, it will interfere with TF4 being promptly serviced. The reason is that the total time to complete eight transfers RT1 through RTS or TF1 through TFS is equal to the tRC timing parameter of the bank required for TF4. Only one open operation is allowed in the tRC time interval. If TF3, for example, requires an open row that TF4 will not use, then TF4 must open a new row in the bank. To do this, the sense associated with TF4 must wait the unexpired portion of tRC measured from the sense associated with TF3 to perform the open. However, if TF3 opens the same row as that needed by TF4, there is no interference with TF4.

Based on FIG. 32, it is preferred that there be enough banks in the memory device that the chance of two requests interfering with each other is small. While the interference due to row conflicts within a bank is not possible to eliminate due to the random nature of the reference stream, a large number of banks will reduce substantially the chance of a conflict. In one embodiment according to the present invention, the time parameter tRC is approximately SO ns and at least eight banks are preferred to reduce conflicts. In another embodiment, 64 banks are present in the memory device to reduce conflicts. In the case of multiple devices, the chance of bank conflicts is reduced.

In one embodiment according to the present invention, the device which sends requests to the memory device handles the timing constraints, such as tRC. In another embodiment, the memory device handles the timing constraints by storing the requests until they can be serviced.

Figure 33:
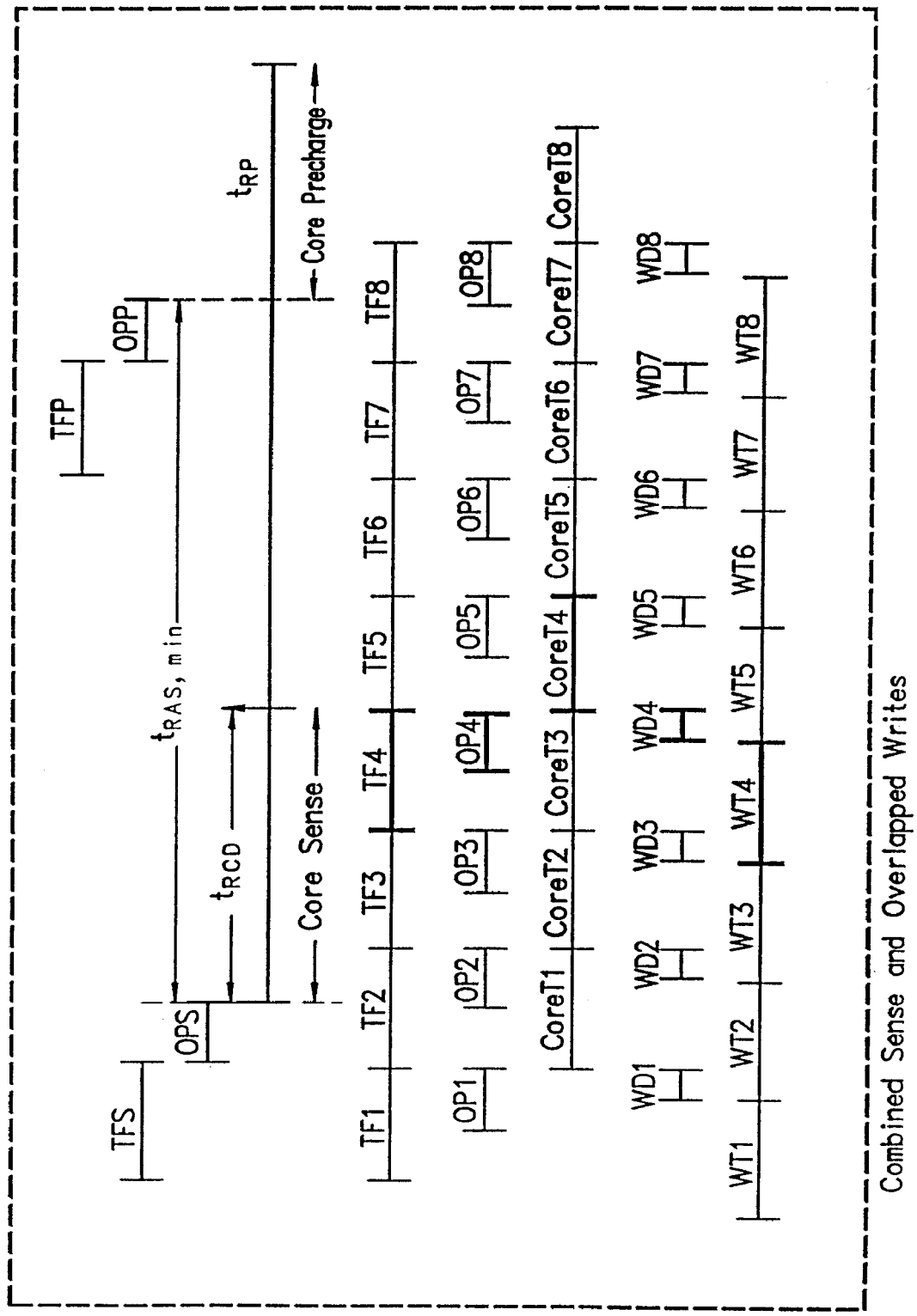
FIG. 33 illustrates combined sense and overlapped write operations in accordance with an embodiment of the invention.

FIG. 33 is similar to FIG. 32, except that a sequence of writes is shown. Write transfer packet delivered during TF4 is timed so that write data delivered during WT4 is ready when the bank and row are ready for the TF4 operation. The timing in this figure is subject to the same constraints as the timing in FIG. 32.

Figure 34:
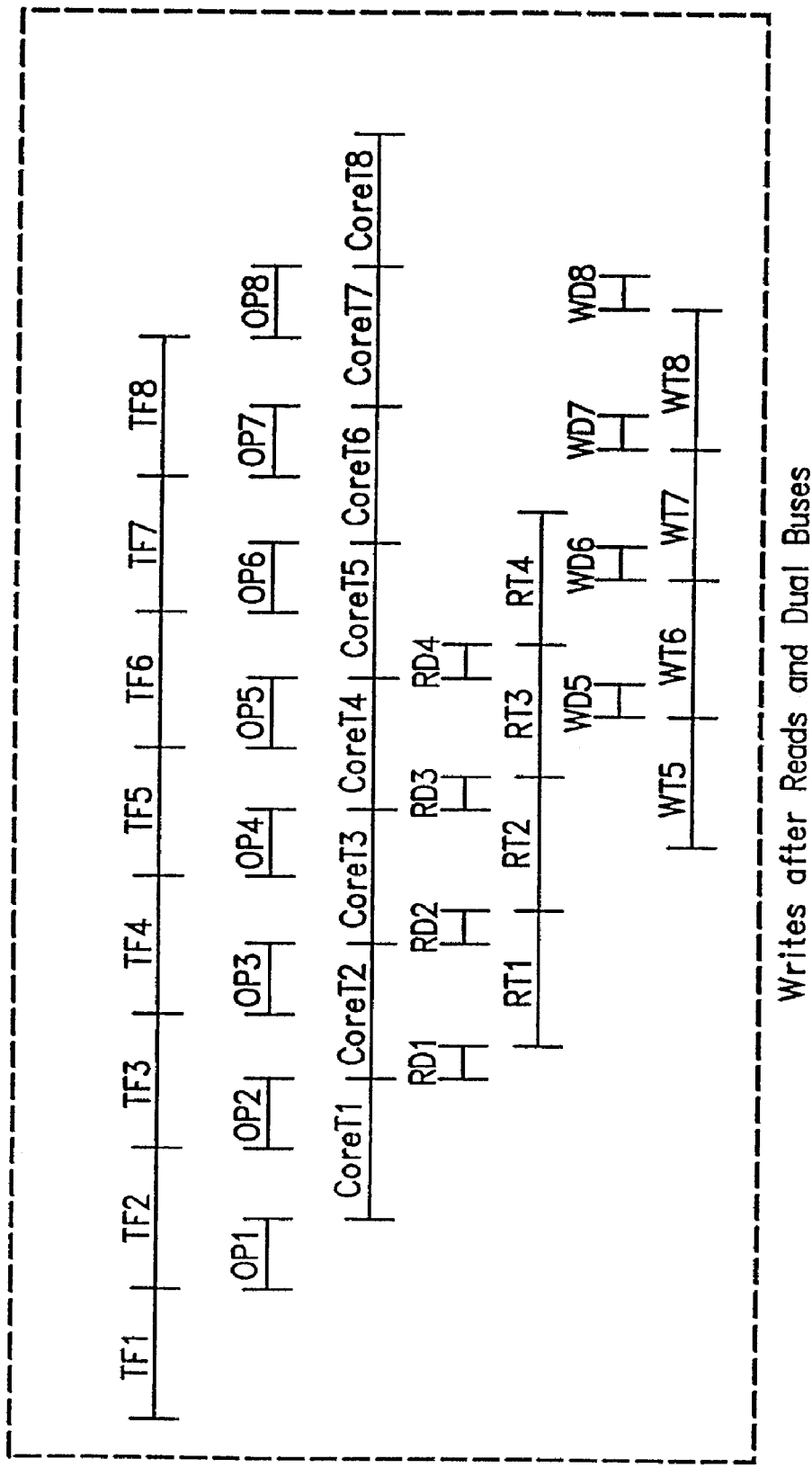
FIG. 34 illustrates writes after reads and dual buses in accordance with an embodiment of the invention.

FIG. 34 shows a timing diagram for the case when a series of reads is followed by a series of writes. In particular, core times CoreT1, CoreT2, CoreT3 and CoreT4 carry out read operations. However, core times CoreT5, CoreT6, CoreT7 and CoreT8 carry out write operations. This case points out the need for independent column I/O buses rather than the bidirectional column I/O bus 2074 shown in FIG. 20. The memory device shown in FIG. 16 in which there are separate column I/O paths 1674 and 1676 to and from the inner core, performs the operations in FIG. 34 as shown without the pipeline having any stalls.

Figure 35:
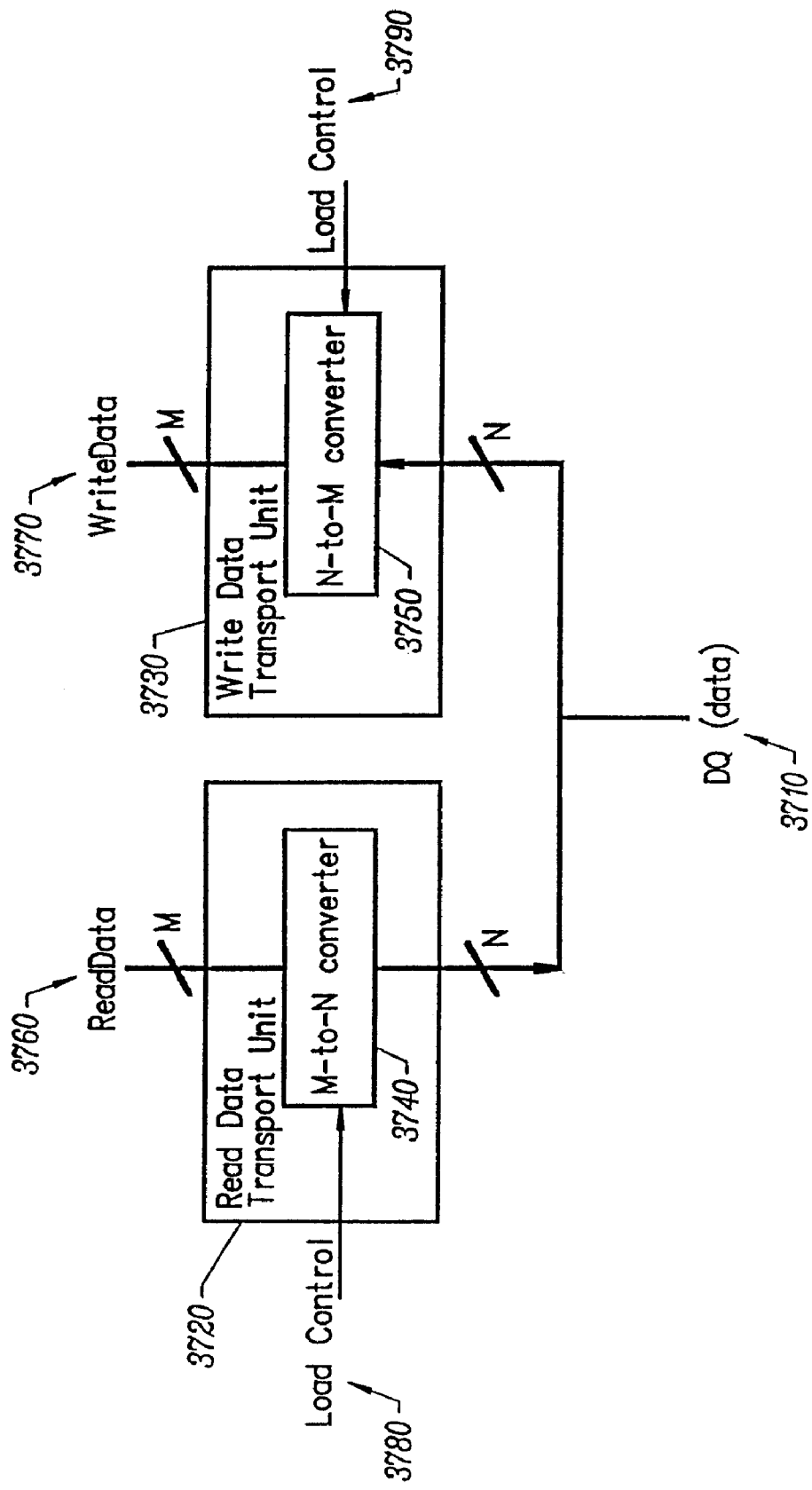
FIG. 35 illustrates a memory structure in accordance with an embodiment of the invention.

FIG. 35 shows an embodiment according to the present invention of the write and read data transport units 2064, 2066 shown in FIG. 20. In FIG. 35, Read Data Transport Unit 3720 comprises an M-to-N converter 3740 which is coupled to the M-bit read data bus 3760. This bus corresponds to path 2075 in FIG. 20. The M-to-N converter 3740 is also coupled to the external data bus DQ 3710, shown as external connections 2028 in FIG. 20. In one embodiment, the read data bus has 144 bits (M=144) and the DQ bus is 18 bits (N=18), giving an M to N ratio of 8 to 1. In FIG. 35, Write Data Transport Unit 3730 comprises an N-to-M converter 3750 which couples the N-bit DQ bus to an M-bit path 3770 which corresponds to path 2073 in FIG. 20. With a ratio of 8 to 1 for the M-to-N converter 3740, the DQ bus cycles at a rate that is eight times faster than the cycle rate of the Read Data bus 3760. In one embodiment according to the present invention, Read Data 3760 has a cycle time of 10 ns. This means that the cycle time of the DQ bus is 1.25 ns. In another embodiment, the cycle time of the DQ bus is 1.67 ns and with the S to 1 ratio the Read Data cycle time is 13.3 ns.

Figure 36:
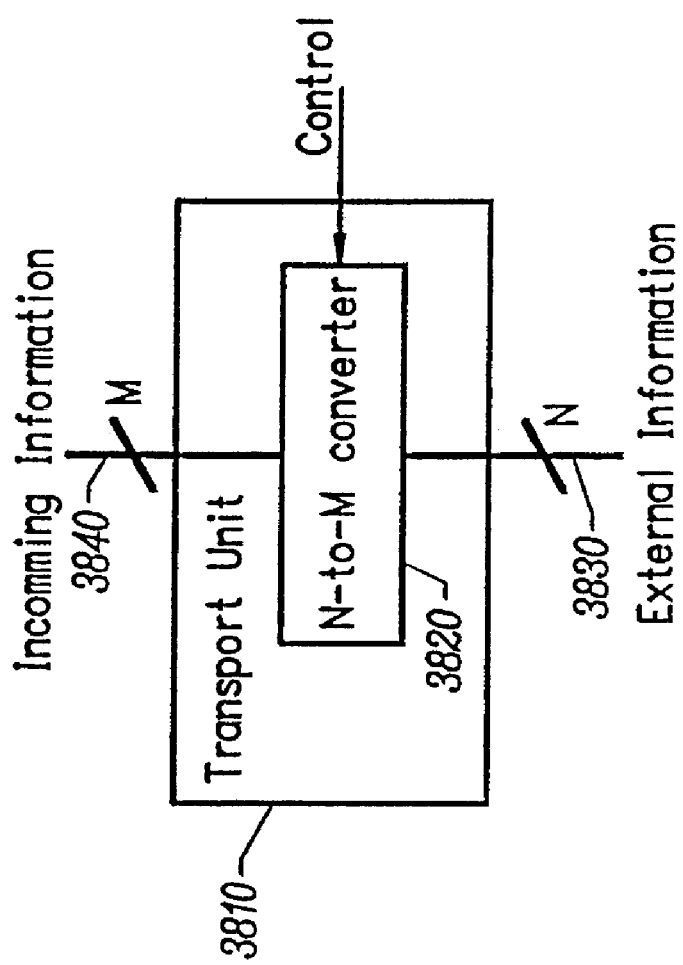
FIG. 36 illustrates a transport unit in accordance with an embodiment of the invention.

FIG. 36 shows an embodiment according to the present invention of a Refresh, Sense, Precharge, Close, or Transfer Transport Unit. Again an N-to-M converter 3820 is used to match the cycle rate of the external connections to the internal information rate. In one embodiment, the converter is an 8 to 1 converter to match the data bus converter. In one embodiment according to the present invention, for the Sense Transport Unit, the size of the incoming information is 24 bits (M=24) and the convener is an 8-to-1 converter. Therefore, N equals 3. For this embodiment, the Precharge Transport unit incoming information is 16 bits, so N equal 2. For the Close Transport Unit, incoming information is 16 bits, so N equals 2, and for the Transfer Transport Unit the incoming information is 24 bits, so N equals 3 according to the packet formats discussed above. The total information rate for all of these units is 80 bits/10 ns=1 Gigabyte per second. Thus, the embodiment in FIG. 20 according to the present invention has a control throughput sufficient to sustain the data throughput of 144 bits/10 ns.

As discussed above, to support the 8 to 1 ratio for the converter in the Transport Unit, requires that the cycle time of the external connections in FIG. 20 be on the order of one nanosecond when the transport time is approximately 10 ns. In another embodiment, external connection cycle rates are slower than one nanosecond and more external connections are required. For example, if the external connection cycle rate is 2.5 ns, but 144 bits are still required every 10 ns then the converter is a 4-to-1 converter and the number of external connections is 36. If the external connection cycle rate is 10 ns, and 144 bits are still required every 10 ns for the WriteData 3770 or ReadData 3760 in FIG. 35 then 144 external connections are required. It is preferred that the number of external connections be suitable for a single integrated circuit package so fewer external connections are preferred.

Figure 37:
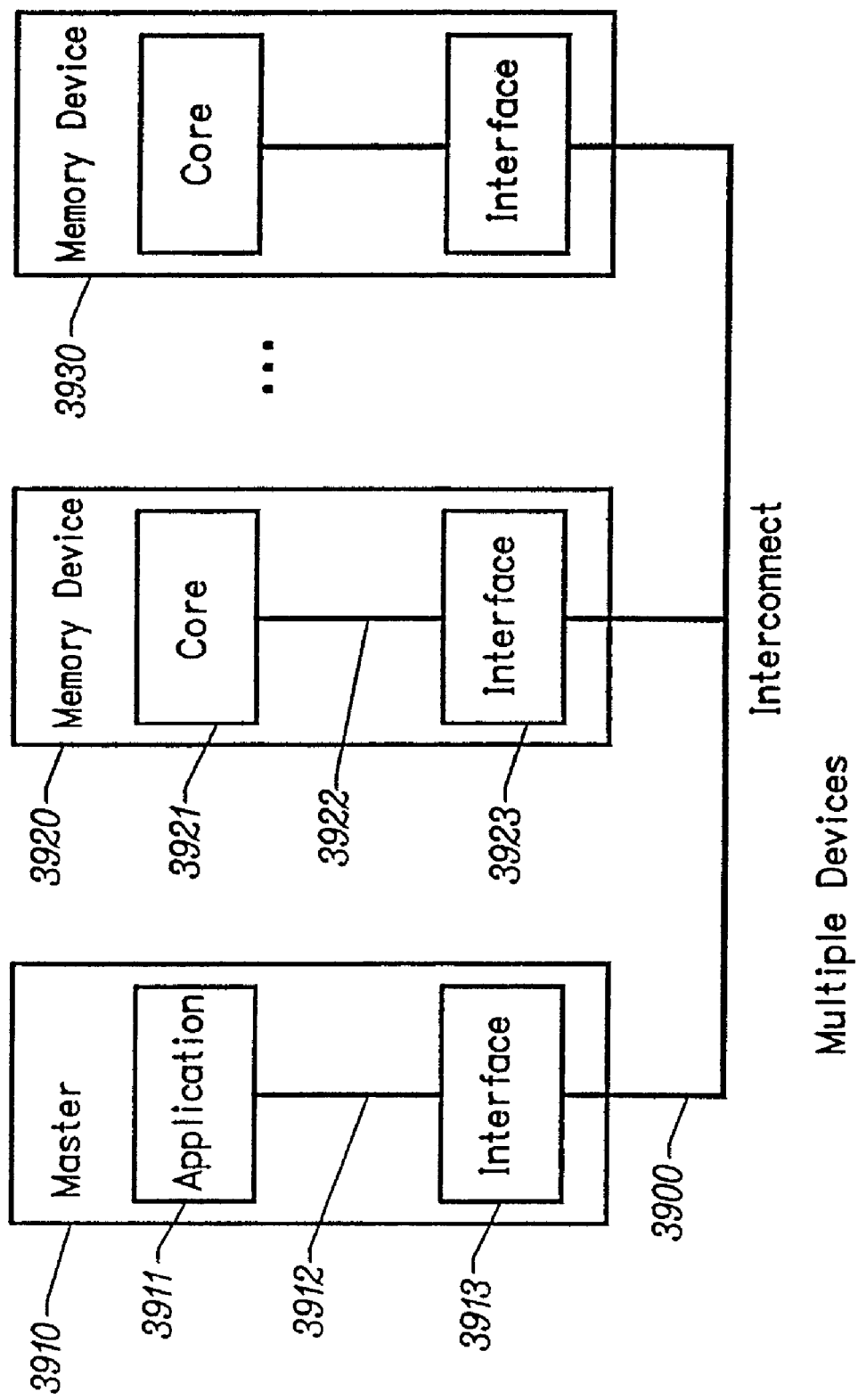
FIG. 37 illustrates a memory architecture in accordance with an embodiment of the invention.

FIG. 37 shows an embodiment according to the present invention in which multiple memory devices 3920 through 3930 are connected together to the same set of external connections 3900, thereby creating an interconnect bus for the memory devices. Also coupled to the bus is a master device or controller 3910 for the purpose of sending the information packets to the memory devices and sending and receiving write and read data respectively on behalf of the application layer 3911 in the master. In one embodiment according to the present invention shown in FIG. 37, interface 3923 in the memory devices is the collection of transport and operation units shown in FIG. 20 including any support circuitry such as control registers and refresh circuitry necessary to support the universal sequence for the specific type of memory core 3921 used in the memory device. In FIG. 37 each memory core 3921 in the memory device may be different. For example, in one embodiment, memory device 3920 has a dynamic memory core and memory device 3930 has a static memory core. In another embodiment, memory device 3920 has a read only core and memory device 3930 has a NAND type dynamic memory core. As discussed above, the transport units and operation units adapt the interconnect bus to the memory core and operate in a pipeline to deliver high throughput. A memory system configured as in FIG. 37 also has the benefit that as more memory devices are added, more memory bank resources become available to help reduce conflicts. For example, if there are two memory device each having 64 banks, then there are a total of 128 banks for servicing a memory request. There are two effects of having more memory banks. The first is that the chance of a request finding the row it needs open in a bank of one of the memory devices is increased. This reduces the time for servicing requests that have good spatial locality. The second is that the chance of memory requests needing the same bank is reduced. This helps reduce service time in the case of requests with poor spatial locality.

Another aspect of the multiple device system shown in FIG. 37 is that each memory device according to the present invention can participate in the pipelined operation because the information fields for any of the steps in the universal sequence, i.e., precharge, sense, read or write, close, specify the particular memory device. This means that multiple devices may have their activities interleaved on the interconnect bus. In an embodiment according to the present invention, a data packet is received from memory device 3920 and immediately thereafter a data packet is received from memory device 3930 avoiding the limitation of row cycle time. This embodiment requires that master 3910 schedule the arrival of the transfer packets to achieve back-to-back data packets. Therefore FIG. 32 applies to the case of multiple devices as well, wherein transport time intervals TF1, TF2, TF3, TF5, TF6, TF7, TF8 may have information specifying for each operation a separate device than the device specified for TF4 and RT1-3 and RTS-8 have the data for different devices. This avoids any bank conflict that might occur were the requests all directed to the same device. Thus the multiple device system shown in FIG. 37 may have higher throughput than a single device system due to the increased number of bank resources.

Thus a memory device capable of high throughput, low service time is described. The memory device can transfer a data packet without interruption to or from any device, row or column address with only bank conflicts due to the locality of reference of the memory reference stream limiting throughput. An embodiment is shown that fully supports all memory operations for a given memory core while transporting the data packet.

Although the invention has been described in considerable detail with reference to certain embodiments thereof, other embodiments are possible. Therefore, the spirit and scope of the appended claims should not be limited to the description of the preferred versions contained therein.

What is claimed is:

1. A semiconductor memory device comprising:
   a memory core including at least eight banks of dynamic random access storage cells;
   an internal data bus coupled to the memory core, the internal data bus to receive a plurality of data bits from a selected bank of the memory core;
   a first interface to receive a read command from external to the semiconductor memory device; and
   a second interface to output a first subset of the plurality of data bits and a second subset of the plurality of data bits, wherein:
      the first subset is output during a first phase of an external clock signal, wherein the first phase of the external clock signal includes a first edge transition; and
      the second subset is output during a second phase of the external clock signal, wherein the second phase of the external clock signal includes a second edge transition, wherein the second edge transition is an opposite edge transition with respect to the first edge transition.

2. The semiconductor memory device of claim 1, wherein the first subset and the second subset are each one eighth of a total number of data bits of the plurality of data bits.

3. The semiconductor memory device of claim 1, further including a circuit to receive the external clock signal and to generate an internal clock signal to time the transfer of the first and second subsets.

4. The semiconductor memory device of claim 3, wherein the circuit to receive the external clock signal includes one of delay locked circuitry and phase locked circuitry.

5. The semiconductor memory device of claim 1, wherein a first bank of the at least eight banks is capable of performing a sense operation while a second bank of the at least eight banks performs a precharge operation.

6. A semiconductor memory device comprising:
a memory core having at least eight banks of dynamic random access storage cells;
a first set of connections to receive a read command;
an internal data path, coupled to the memory core, to transport a first plurality of data bits accessed from a first bank of the at least eight banks in response to the read command; and
a second set of connections to output, on each of two phases of an external clock signal, a respective subset of the first plurality of data bits in response to the read command, wherein the first plurality of data bits is at least eight times as numerous as each respective subset of the first plurality of data bits.

7. The semiconductor memory device of claim 6, further including a circuit to receive the external clock signal and to generate an internal clock signal to time the transfer of each respective subset.

8. The semiconductor memory device of claim 7, wherein the circuit to receive the external clock signal includes one of delay locked circuitry and phase locked circuitry.

9. The semiconductor memory device of claim 6, wherein a first bank of the at least eight banks is capable of performing a sense operation while a second bank of the at least eight banks performs a precharge operation.

10. A semiconductor memory device comprising:
a memory core including eight banks of dynamic random access storage cells;
an internal data bus coupled to the memory core, the internal data bus to transfer M bits of parallel data from a selected bank of the eight banks;
a first interface to receive control information that specifies a read operation from first connections external to the semiconductor memory device; and
a second interface to transfer N bits of the parallel data, on a single phase of a cycle of an external clock signal, to second connections external to the semiconductor memory device, wherein M is at least eight times N;
wherein a first N bits of the parallel data are transferred during a first phase of the cycle, wherein the first phase of the cycle includes a first edge transition; and
wherein a second N bits of the parallel data are transferred on a second phase of the cycle, wherein the second phase of the cycle includes a second edge transition, wherein the second edge transition is an opposite edge transition with respect to the first edge transition.

11. The semiconductor memory device of claim 10, further including a circuit to receive the external clock signal and to generate an internal clock signal to time the transfer of the first N bits and of the second N bits.

12. The semiconductor memory device of claim 10, wherein the circuit to receive the external clock signal includes one of delay locked circuitry and phase locked circuitry.

13. A memory device built on a single semiconductor substrate, the memory device comprising:
a memory core including at least eight banks of dynamic random access storage cells wherein a first bank of the at least eight banks is capable of performing a sense operation while a second bank of the at least eight banks performs a precharge operation;
a first interface to receive a read command from external to the memory device, wherein data is accessed, in response to the read command, from a selected bank of the at least eight banks, wherein a sense operation was performed in the selected bank; and
a second interface to output, in response to the read command, a first subset of the accessed data and a second subset of the accessed data, wherein:
the first subset is output during a first phase of an external clock signal, wherein the first phase of the external clock signal includes a first edge transition; and
the second subset is output during a second phase of the external clock signal, wherein the second phase of the external clock signal includes a second edge transition, wherein the second edge transition is an opposite edge transition with respect to the first edge transition.

14. The memory device of claim 13, wherein the first subset and the second subset are each one eighth of a total number of data bits of the accessed data.

15. The memory device of claim 13, further including a circuit to receive the external clock signal and to generate an internal clock signal to time the transfer of the first and second subsets.

16. The memory device of claim 15, wherein the circuit to receive the external clock signal includes one of delay locked circuitry and phase locked circuitry.

17. A method of operating a semiconductor memory device that includes a memory core having at least eight banks of dynamic random access storage cells, the method comprising:
receiving a read command from a first set of external connections;
transporting data bits accessed from the memory core in response to the read command;
outputting, on a second set of external connections, a first subset of the data bits and a second subset of the data bits, wherein:
the first subset is output during a first phase of an external clock signal, wherein the first phase of the external clock signal includes a first edge transition; and
the second subset is output during a second phase of the external clock signal, wherein the second phase of the external clock signal includes a second edge transition, wherein the second edge transition is an opposite edge transition with respect to the first edge transition.

18. The method of claim 17, further comprising:
performing a sense operation in a first bank of the at least eight banks, wherein the data bits are accessed from the first bank after the sense operation is initiated in the first bank; and
performing a precharge operation in a second bank of the at least eight banks at the same time as performing the sense operation in the first bank.

19. The method of claim 18, wherein the sense operation is performed in response to receiving a command that specifies sensing the first bank.

20. The method of claim 18, further comprising receiving a bank address that selects the first bank for the sense operation.

21. The method of claim 18, wherein the precharge operation is performed in response to receiving a command that specifies precharging the second bank.

22. The method of claim 18, further comprising receiving a bank address that selects the second bank for the precharge operation.

23. The method of claim 17, further comprising receiving a write command, wherein the second set of external connections receives data corresponding to the write command.

24. The method of claim 17, further comprising receiving a refresh command that specifies refreshing the dynamic random access memory cells.

25. The method of claim 17, further comprising receiving a command that specifies a power state.

* * * * *